US010210941B1

(12) United States Patent
Chen et al.

(10) Patent No.: US 10,210,941 B1
(45) Date of Patent: Feb. 19, 2019

(54) REDUCING INJECTION TYPE OF READ DISTURB IN A COLD READ OF A MEMORY DEVICE

(71) Applicant: SanDisk Technologies LLC, Plano, TX (US)

(72) Inventors: Hong-Yan Chen, San Jose, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/879,084

(22) Filed: Jan. 24, 2018

(51) Int. Cl.
| G11C 16/04 | (2006.01) |
| G11C 16/34 | (2006.01) |
| G11C 16/30 | (2006.01) |
| G11C 16/26 | (2006.01) |
| G11C 16/32 | (2006.01) |
| G11C 16/10 | (2006.01) |

(52) U.S. Cl.
CPC ...... *G11C 16/3427* (2013.01); *G11C 16/0483* (2013.01); *G11C 16/10* (2013.01); *G11C 16/26* (2013.01); *G11C 16/30* (2013.01); *G11C 16/32* (2013.01)

(58) Field of Classification Search
None
See application file for complete search history.

(56) References Cited

U.S. PATENT DOCUMENTS

| 8,670,285 | B2 | 3/2014 | Dong et al. | |
| 8,949,555 | B1* | 2/2015 | Karamcheti | G06F 13/4282 |
| | | | | 711/158 |
| 9,245,642 | B1* | 1/2016 | Chen | G11C 16/3427 |
| 9,361,993 | B1 | 6/2016 | Chen et al. | |
| 9,711,231 | B1 | 7/2017 | Yip et al. | |
| 9,715,937 | B1 | 7/2017 | Pang et al. | |
| 9,747,992 | B1 | 8/2017 | Chen et al. | |
| 9,922,717 | B1* | 3/2018 | Maejima | G11C 16/0483 |
| 2009/0268524 | A1 | 10/2009 | Maejima | |
| 2016/0225461 | A1 | 8/2016 | Tuers et al. | |

* cited by examiner

*Primary Examiner* — Uyen B Tran
(74) *Attorney, Agent, or Firm* — Vierra Magen Marcus LLP

(57) ABSTRACT

A memory device and associated techniques for optimizing the channel boosting level in an unselected NAND string during a read operation for a selected NAND string. A tracking circuit tracks an indicator of a floating voltage of unselected word lines of a block. For example, this can include tracking a time since a last sensing operation, and determining whether a power on event has occurred without a subsequent sensing operation. In response to a read command, the indicator is used to set parameters in the read operation which can reduce disturbs. This can include setting a duration and/or a magnitude of a select gate voltage pulse during the increase of the voltage of the unselected word lines. The duration and/or a magnitude of the control gate voltage pulse can also be set based on a temperature.

19 Claims, 21 Drawing Sheets

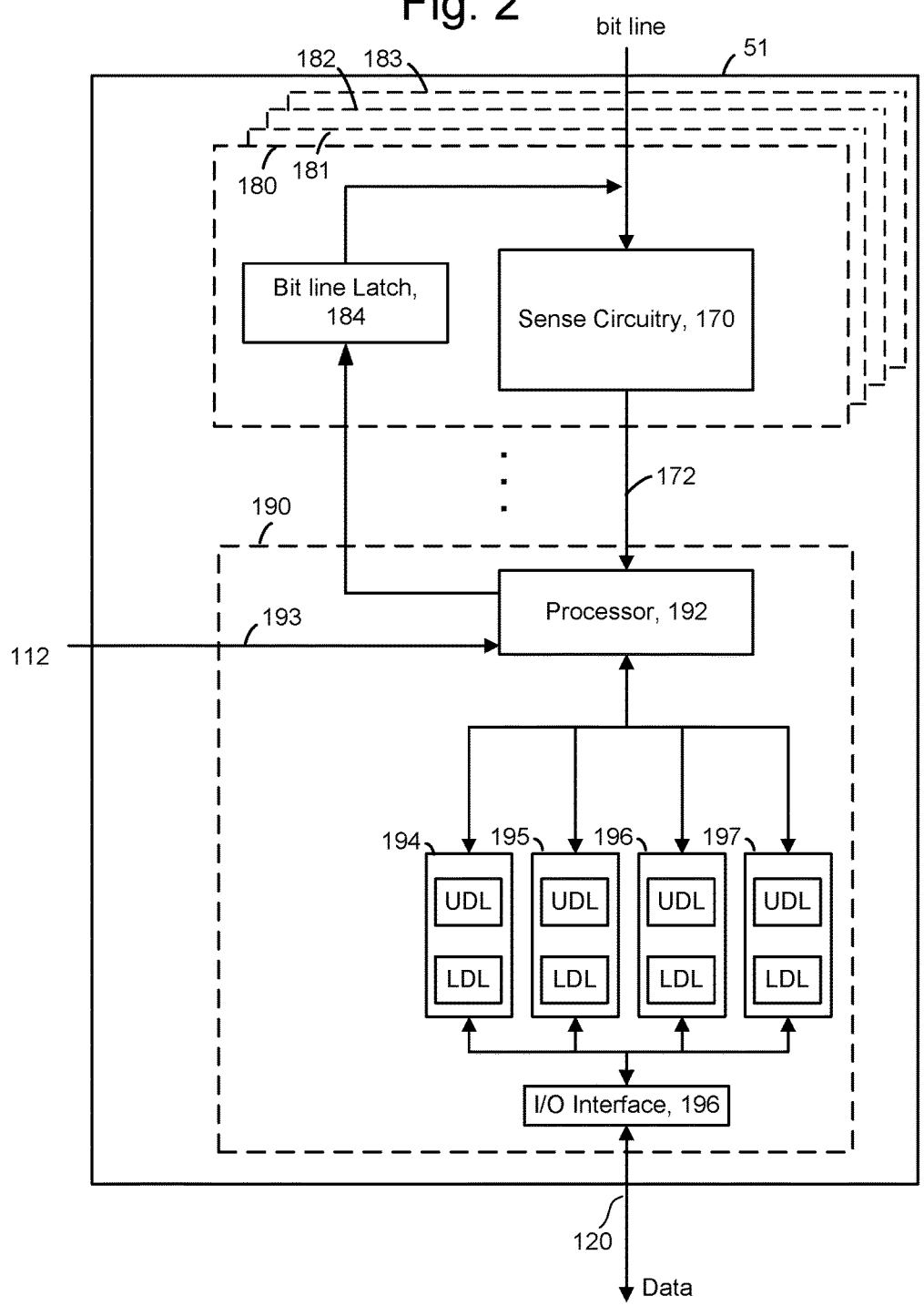

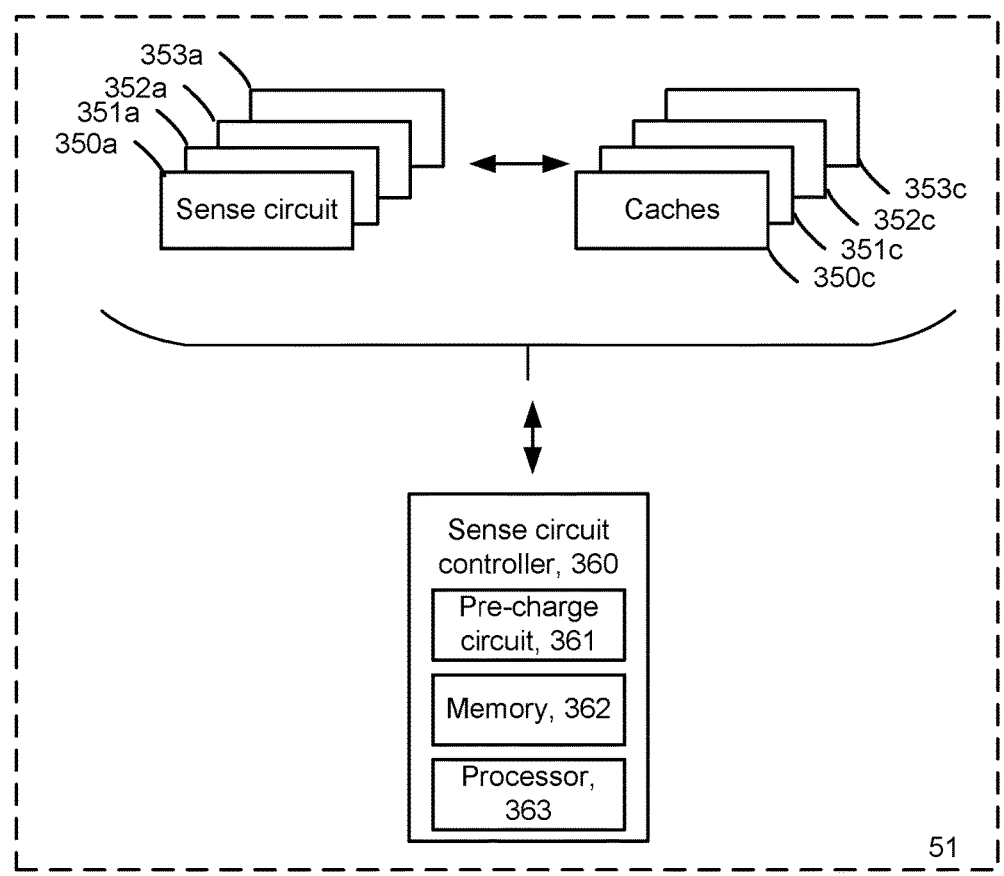

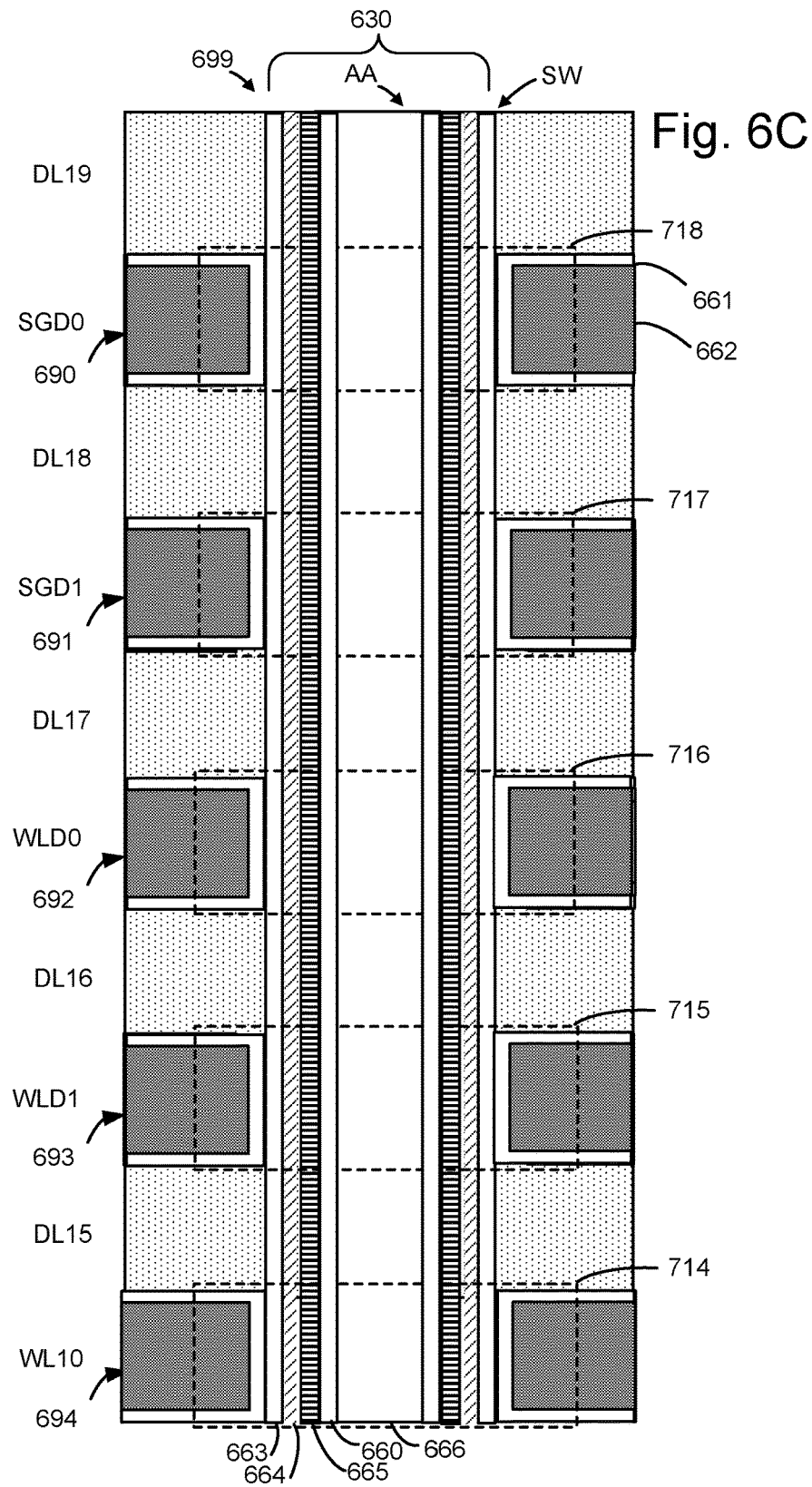

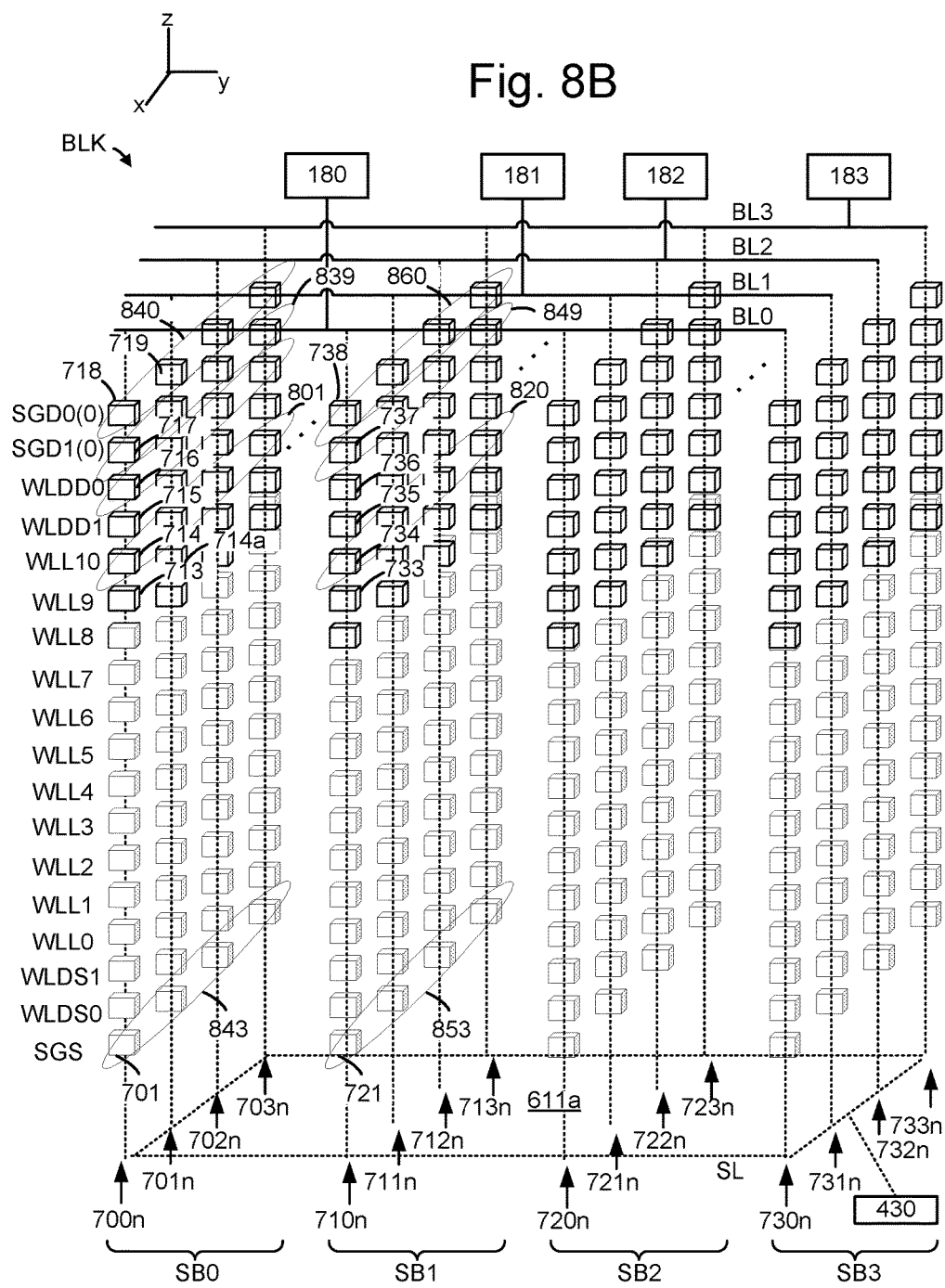

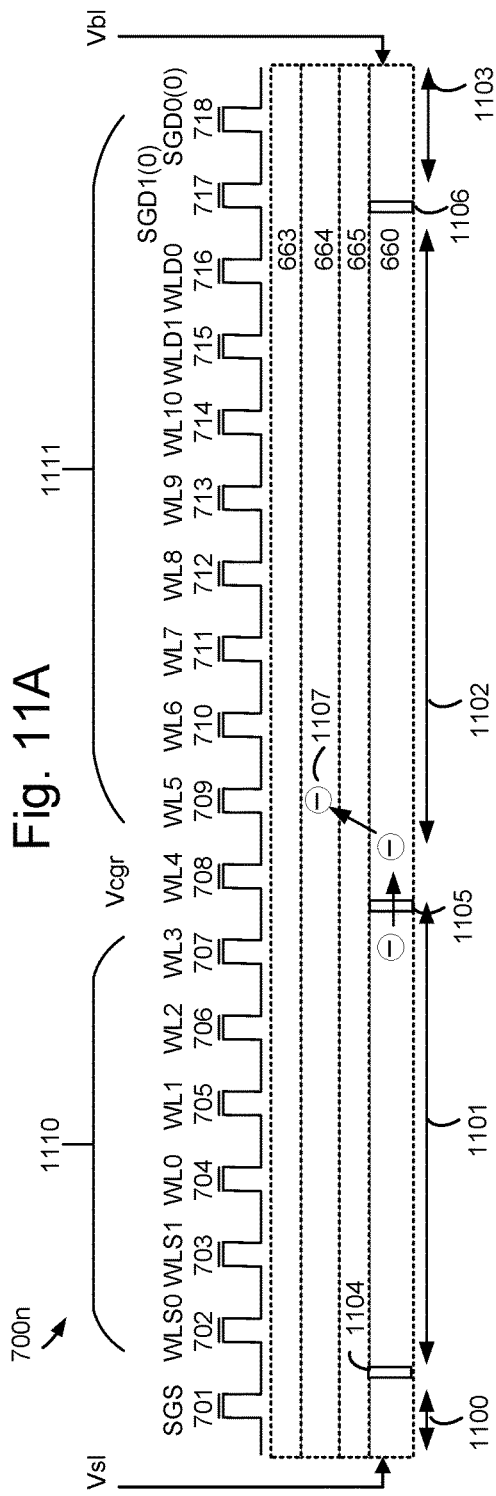

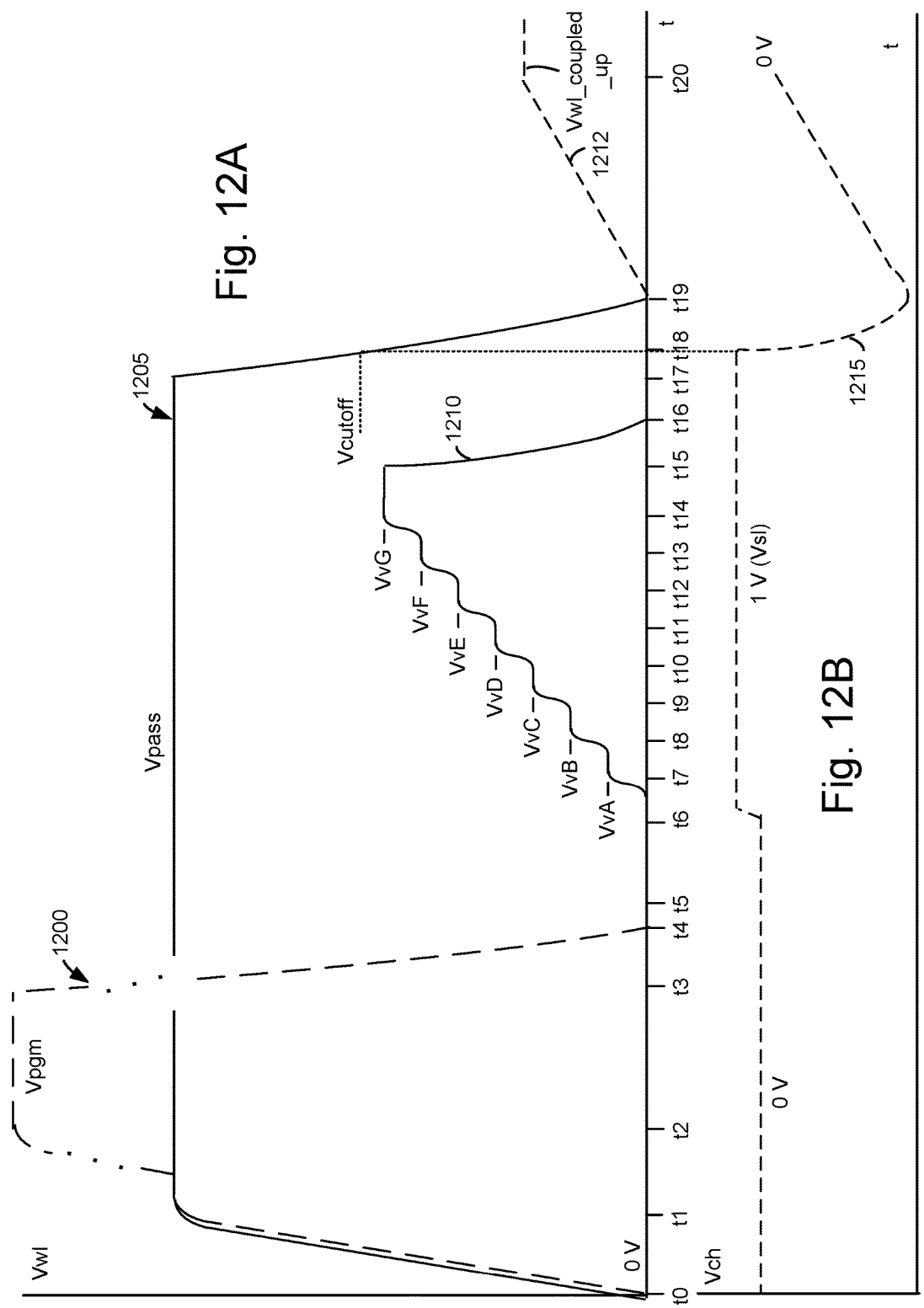

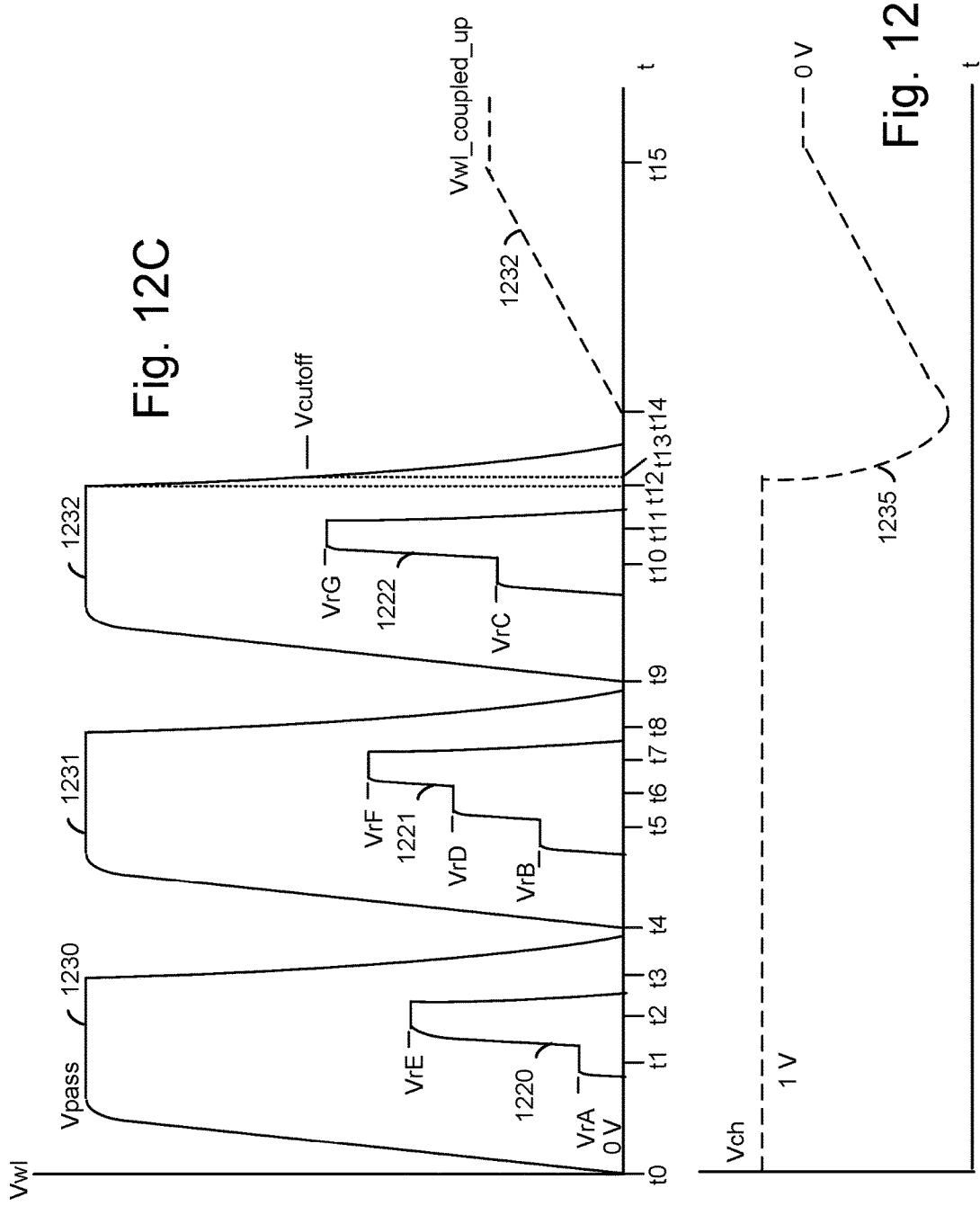

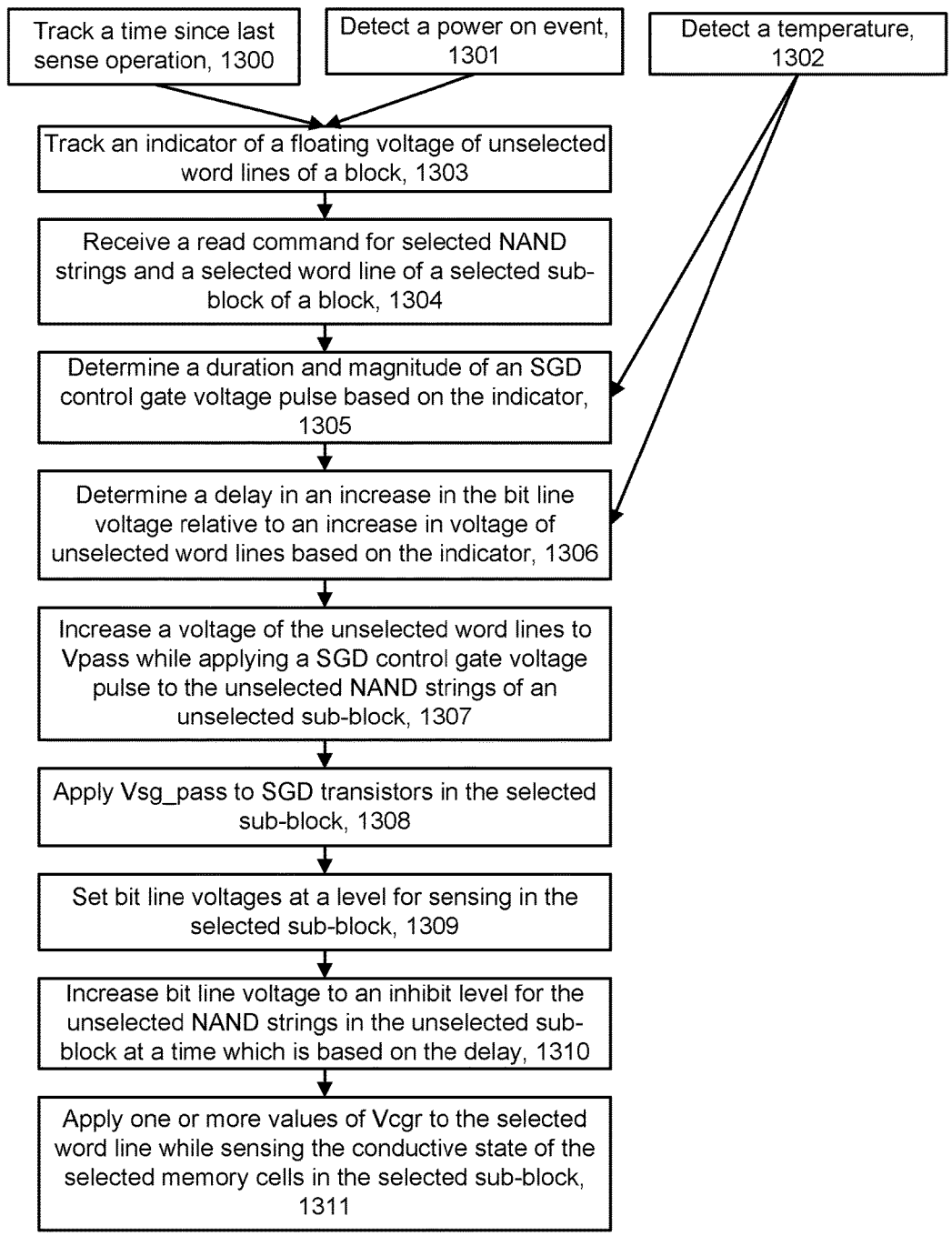

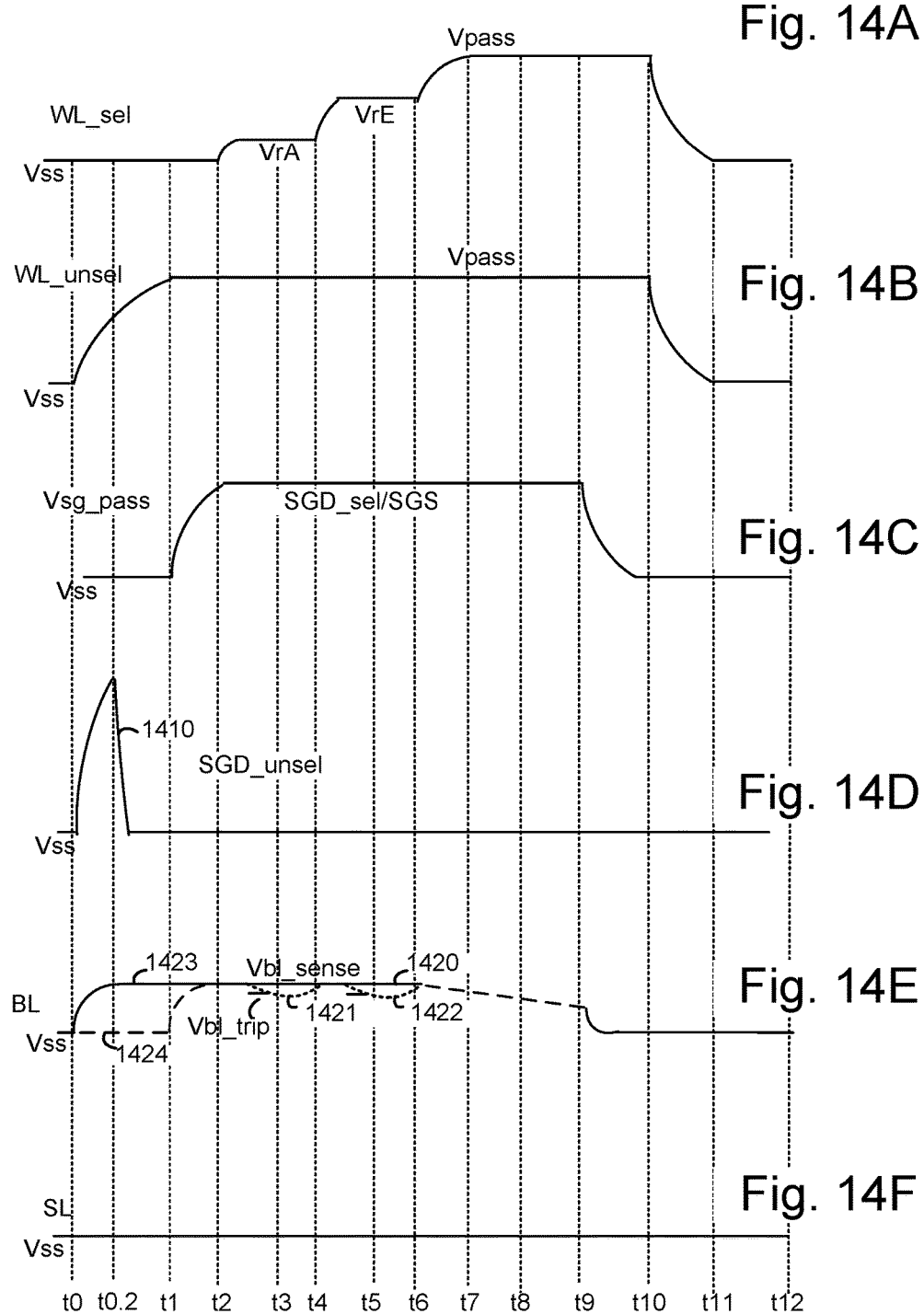

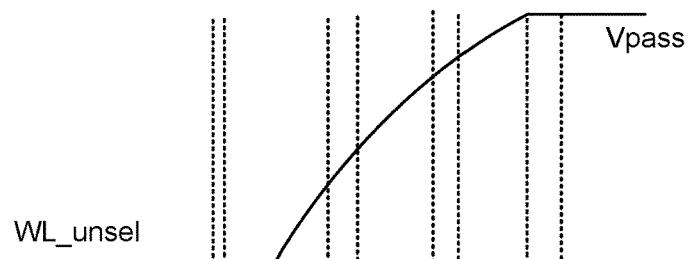
Fig. 15A
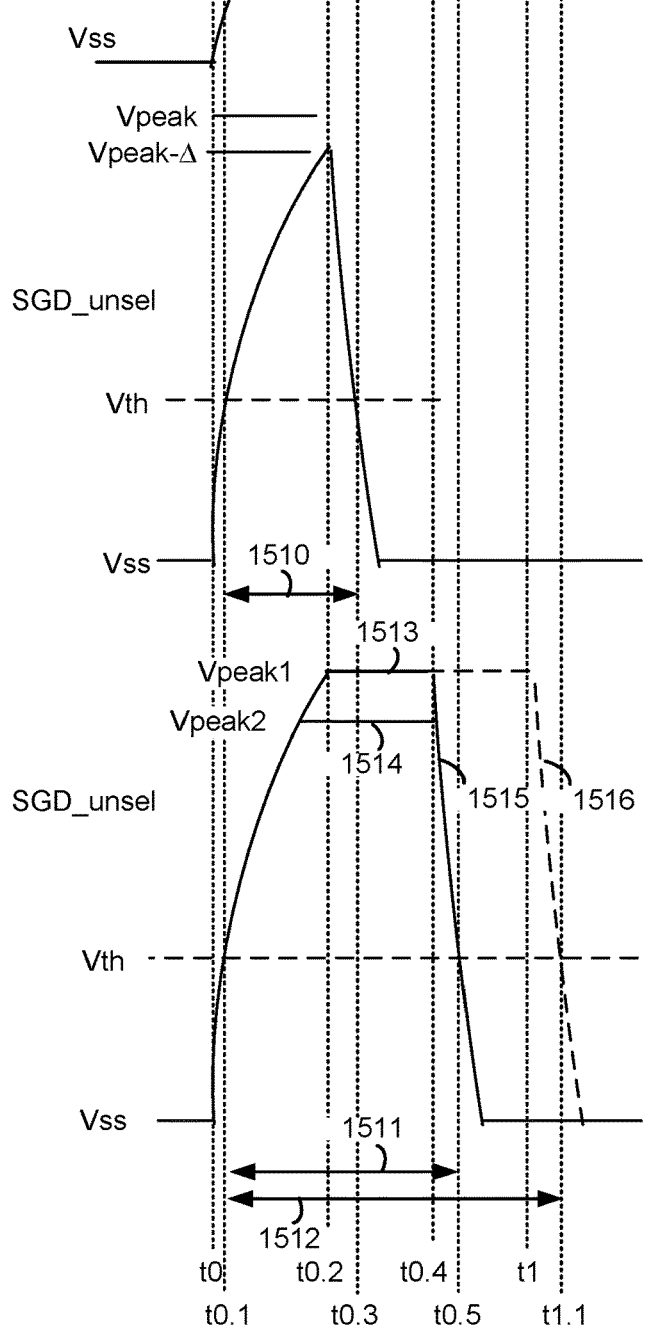
Fig. 15B
Fig. 15C

REDUCING INJECTION TYPE OF READ DISTURB IN A COLD READ OF A MEMORY DEVICE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of the NAND string to selectively connect a channel of the NAND string to a source line or bit line. However, various challenges are presented in operating such memory devices.

BRIEF DESCRIPTION OF THE DRAWINGS

FIG. 2 is a block diagram depicting one embodiment of the sense block 51 of FIG. 1.

FIG. 3 depicts another example block diagram of the sense block 51 of FIG. 1.

FIG. 6C depicts a close-up view of the region 622 of the stack of FIG. 6A.

FIG. 8B depicts additional detail of the sub-blocks SB0-SB3 of FIG. 7.

FIG. 11A depicts a plot of the NAND string 700n of FIG. 7, showing the movement of electrons during a read operation which cause a disturb.

FIG. 11B depicts a table showing control gate voltages of the memory cells and select gate transistors in FIG. 11A, (1a) before a read operation when the control gate voltages are floating and there is a first read situation, (1b) before a read operation when the control gate voltages are floating and there is a second read situation, (2) at a start of the read operation when the control gate voltages are at 0 V and (3) after the control gate voltages are increased to a level used for sensing.

FIG. 11C depicts a table showing voltages in the channel 660 of FIG. 11A for the case of a first read situation without an SGD control gate voltage pulse, consistent with FIG. 11B, rows 1a, 2 and 3.

FIG. 11D depicts a table showing voltages in the channel 660 of FIG. 11A for the case of a second read situation without an SGD control gate voltage pulse, consistent with FIG. 11B, rows 1b, 2 and 3.

FIG. 11E depicts a table showing voltages in the channel 660 of FIG. 11A for the case of a first read situation with an SGD control gate voltage pulse, consistent with FIG. 11B, rows 1a, 2 and 3.

FIG. 12A depicts a plot of example waveforms in a program operation, showing coupling up of a word line voltage.

FIG. 12B depicts a plot of a channel voltage (Vch) corresponding to FIG. 12A.

FIG. 12C depicts a plot of example waveforms in a read operation, showing coupling up of a word line voltage.

FIG. 12D depicts a plot of a channel voltage (Vch) corresponding to FIG. 12C.

FIG. 13 depicts a flowchart of an example read operation which reduces read disturb, consistent with the example of FIG. 11E.

FIG. 14A to 14F depicts example voltage signals in a read operation consistent with FIG. 13.

FIG. 14A depicts an example voltage signal for a selected word line.

FIG. 14B depicts an example voltage signal for unselected word lines.

FIG. 14C depicts an example voltage signal for selected SGD transistors and for SGS transistors in a sensing process.

FIG. 14D depicts an example voltage signal for unselected SGD select gate transistors.

FIG. 14E depicts example voltage signals for a bit line.

FIG. 14F depicts an example voltage signal for a source line in a sensing process.

FIG. 15A depicts a detailed view of the voltage signal for unselected word lines of FIG. 14B from t0-t1.

FIG. 15B depicts a detailed view of the voltage signal for unselected SGD select gate transistors of FIG. 14D from t0-t1.

FIG. 15C depicts alternative voltage signals for unselected SGD select gate transistors.

DETAILED DESCRIPTION

Apparatuses and techniques are described for reducing disturbs of memory cells in a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical memory strings in a stack, where the stack comprises alternating conductive and dielectric layers. The conductive layers act as word lines which are connected to the memory cells. Each memory string may have the shape of a pillar which intersects with the word lines to form the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

Figure 9:
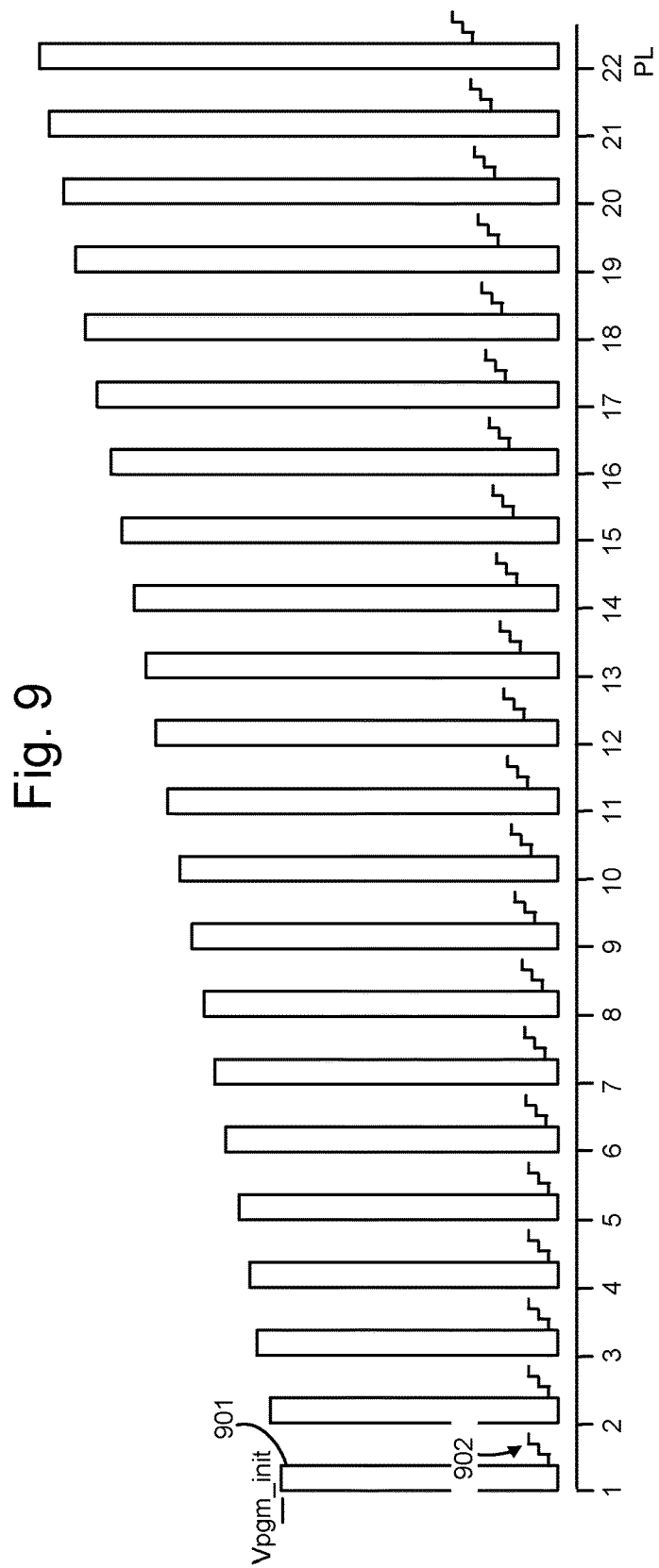
FIG. 9 depicts a voltage signal used in a series of program loops in an example program operation.

During a program operation, the memory cells are programmed according to a word line programming order. For example, the programming may start at the word line at the source-side of the block and proceed to the word line at the drain-side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a series of program loops or program-verify iterations, such as depicted in FIG. 9. Each program loop includes a program voltage followed by one or more verify voltages. The verify voltages are used in verify tests which determine whether the memory cells have completed programming to an assigned data state. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with an assigned data state according to write data in a program command. Based on its assigned data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 10). In a four-bit per cell memory device, there are sixteen data states including the erased state and fifteen higher data states. The data states may be referred to as the S0-S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage (Vth) levels of adjacent data states. During the read operation, the voltages of the unselected word lines are ramped up to a read pass level which is high enough to place the unselected memory cells in a strongly conductive state, to avoid interfering with the sensing of the selected memory cells.

However, it has been observed that the Vth of the memory cells can increase due to disturbs such as those which occur in a read operation. Moreover, the likelihood of a disturb and the severity of a disturb, is a function of a floating (e.g., not driven) voltage of the word lines prior to a read operation. The floating voltage, in turn, is affected by factors including a time since a last sensing operation, whether a sensing operation has occurred since a most recent power on event of the memory device, and a temperature of the memory device. Generally, a lower floating voltage is associated with a greater amount of disturb for reasons discussed further in connection with FIG. 11A to 11E.

Sensing operations such as read and program-verify result in a coupling up of the word line voltages to a level such as 4 V, for reasons explained in connection with FIG. 12A to 12D. However, the word line voltages gradually decay back to 0 V during an idle time of the memory device, if no additional sensing operation is performed. The word line voltages can therefore be in a fully coupled up state, a discharged state or somewhere in between. Moreover, in some situations, the word line voltages are forced to 0 V. For example, after a power on event, e.g., when the memory device is powered up for use, an operation may occur which checks for bad blocks. This operation may involve applying 0 V or other low voltage to the word lines. As a result, any coupling up of the word line voltages is discharged.

A first read or cold read situation can be defined for a block of memory cells when the block has been left idle, without being subject to a sensing operation such as a program-verify or read operation, for a period of time such as thirty minutes or more, or when the block is subject to a power on event and there has not yet been a subsequent sensing operation. In the first read situation, the floating voltages of the word lines decay to, or are driven to, a level at or close to 0 V. A second or hot read situation can be defined for the block when the block has been subject to a sensing operation fairly recently such as a few minutes or less ago. In this situation, the floating voltages of the word line are at, or close to, their peak coupled up level.

Techniques provided herein address the above and other issues. In one approach, a read disturb countermeasure is optimized based on whether the block is in cold or hot read situation, or somewhere in between A tracking circuit can be used to track an indicator of a floating voltage of unselected word lines of a block. For example, this can include tracking a time since a last (most recent) sensing operation, and determining whether a power on event has occurred without a subsequent sensing operation. In response to a read command involving the block, the indicator is used to set parameters in the read operation which can reduce disturbs. For example, this can include setting a duration and/or a magnitude of an SGD control gate voltage pulse during the increase of the voltage of the unselected word lines. See, e.g., FIGS. 14A to 14F and 15A to 15C for further details. Another aspect can involve determining a delay in an increase in the bit line voltage relative to an increase in the voltage of unselected word lines based on the indicator. See, e.g., FIGS. 14F and 17.

Other factors such as temperature can also affect read disturb. In particular, a relatively cold temperature such below −15 to −30 degrees C. can result worsen the disturb. A countermeasure can include increasing the duration and/or a magnitude of an SGD control gate voltage pulse, and/or the delay in the increase in the bit line voltage, when the temperature is relatively cold.

These and other features are discussed further below.

Figure 1A:
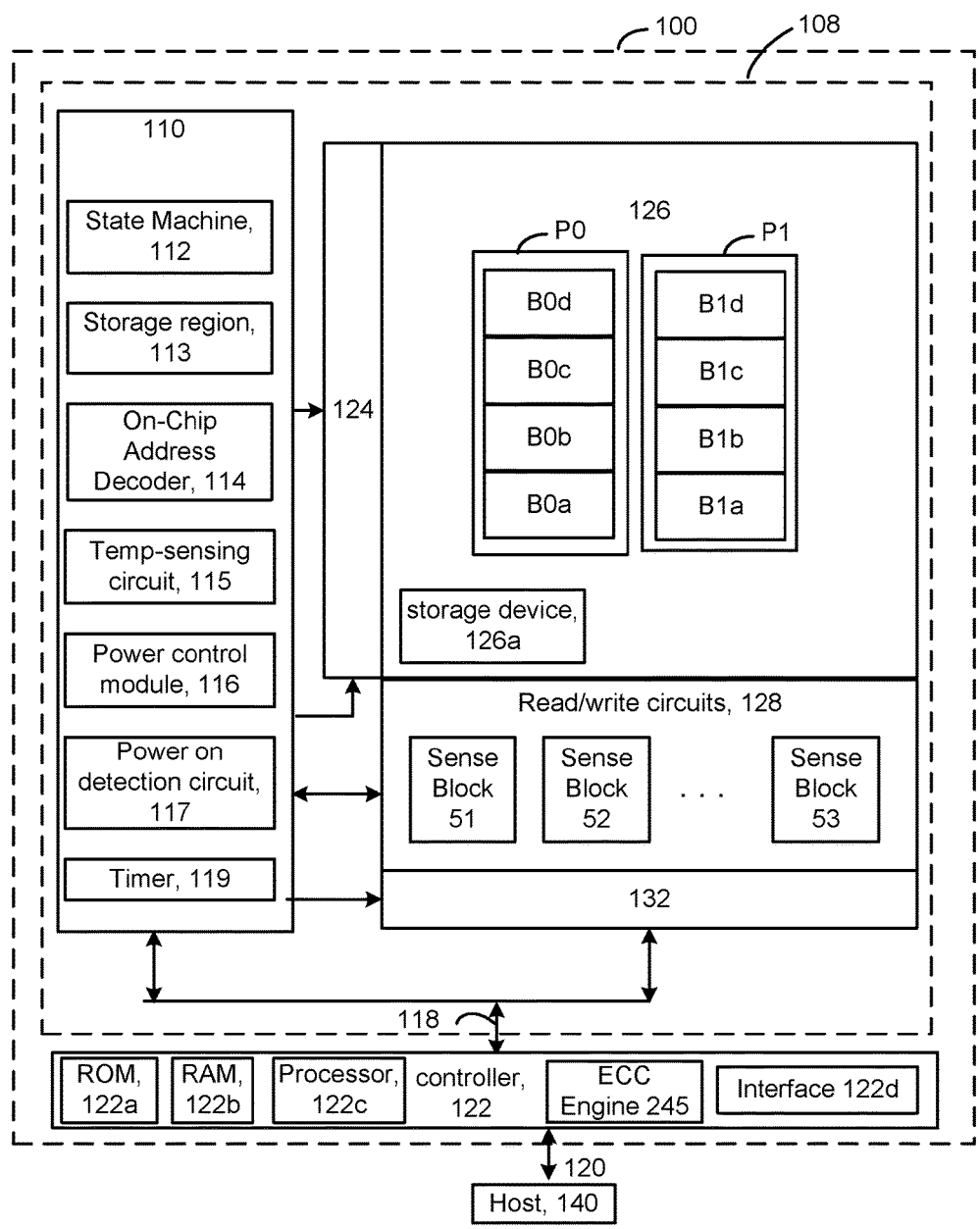
FIG. 1A is a block diagram of an example memory device comprising memory cells arranged in different planes.

FIG. 1A is a block diagram of an example memory device comprising memory cells arranged in different planes. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The memory structure 126 may comprise multiple planes, such as neighbor planes P0 and P1. Each plane may include one or more blocks of memory cells. For example, P0 includes blocks B0a-B0d and P1 includes blocks B1a-B1d.

The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a temperature-sensing circuit 115, a power control module 116, a power on detection circuit 117 and a timer 119.

Figure 1B:
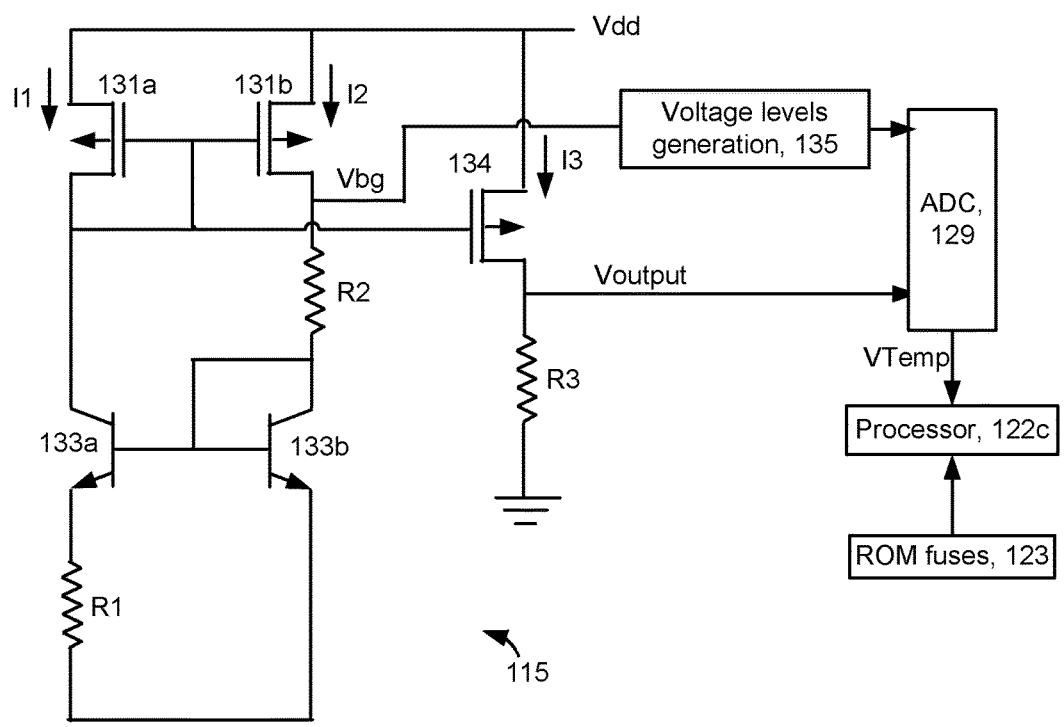
FIG. 1B depicts an example of the temperature-sensing circuit 115 of FIG. 1A.

The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits). The on-chip address decoder 114 provides an address interface between that used by the host or a memory controller to the hardware address used by the decoders 124 and 132. An indication of temperature which is obtained by the temperature-sensing circuit may be used to adjust a read operation, as described further below. FIG. 1B provides an example of a temperature-sensing circuit.

The power control module 116 controls the power and voltages supplied to the word lines, select gate lines, bit lines and source lines during memory operations. It can include drivers for data and dummy word lines, SGS and SGD transistors and source lines. See also FIG. 4. The sense blocks can include bit line drivers, in one approach. The power on detection circuit may be used to detect when the memory device has been powered on. The detection circuit may comprise an event handler which may be a software or firmware routine, or a routine implemented in hardware. The timer may be used to determine a time which has elapsed since a last read operation. The timer may increment based on a clock signal used in the memory device.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 115 of FIG. 1A. The temperature-sensing circuit can be used to determine a temperature to set a duration and/or magnitude of a SGD control gate voltage pulse (see, e.g., FIG. 16A to 16D), for example.

The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

FIG. 2 is a block diagram depicting one embodiment of the sense block 51 of FIG. 1. An individual sense block 51 is partitioned into one or more core portions, referred to as sense circuits 180-183 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

The sense circuit 180, as an example, comprises sense circuitry 170 that performs sensing by determining whether a conduction current in a connected bit line is above or below a predetermined threshold level. Sense circuit 180 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming.

The managing circuit 190 comprises a processor 192, four example sets of data latches 194-197 and an I/O Interface 196 coupled between the set of data latches 194 and data bus 120. One set of data latches, e.g., LDL and UDL, can be provided for each sense circuit. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense circuit 180 may trip at one of these voltages and a corresponding output will be provided from sense circuit 180 to processor 192 via bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL and UDL latches, in a two-bit per storage element implementation. In a three-bit per storage element implementation, an additional data latch may be used. The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuitry sets it to an inhibit value during the verify process.

Each set of data latches 194-197 may be implemented as a stack of data latches for each sense circuit. In one embodiment, there are three data latches per sense circuit 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

FIG. 3 depicts another example block diagram of the sense block 51 of FIG. 1. The column control circuitry can include multiple sense blocks, where each sense block performs sensing, e.g., read, program verify or erase verify operations for multiple memory cells via respective bit lines. In one approach, a sense block comprises multiple sense circuits, also referred to as sense amplifiers. Each sense circuit is associated with data latches and caches. For example, the example sense circuits 350a, 351a, 352a and 353a are associated with caches 350c, 351c, 352c and 353c, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. The sense circuit controller may also include a memory 362 and a processor 363.

Figure 4:
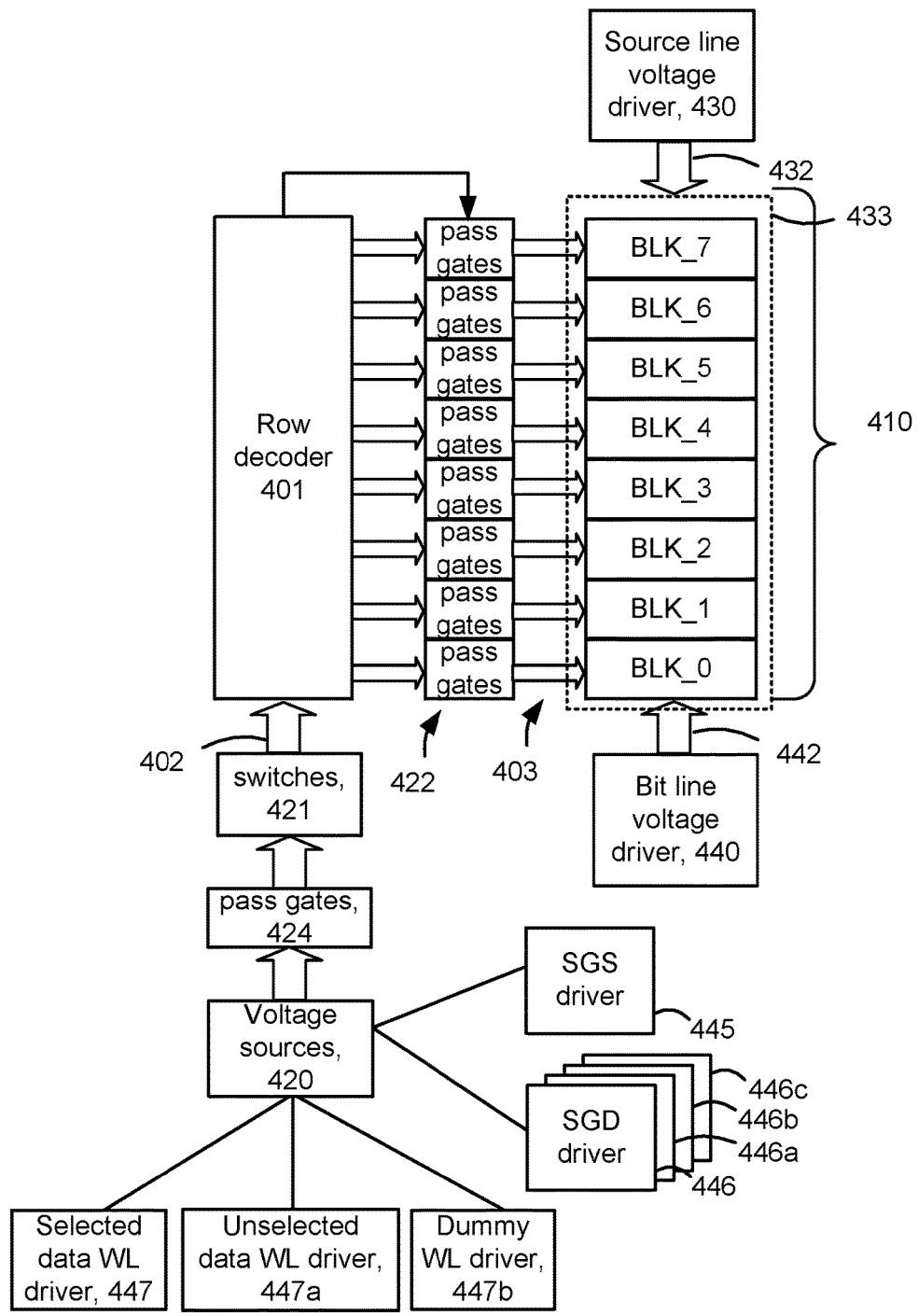
FIG. 4 depicts an example circuit for providing voltages to blocks of memory cells.

FIG. 4 depicts an example circuit for providing voltages to blocks of memory cells. In this example, a row decoder 401 provides voltages to word lines and select gates of each block in set of blocks 410. The blocks could be in a plane and includes blocks BLK_0 to BLK_7. The row decoder provides a control signal to pass transistors 422 which connect the blocks to the row decoder. Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from voltage sources 420. The voltage sources may provide voltages to switches 421 which connect to the global control lines. Pass transistors 424 are controlled to pass voltages from the voltage sources 420 to the switches 421.

The voltage sources 420 can provide voltages on word lines (WL), SGS control gates and SGD control gates, for example. The voltage sources can include a selected word line (WL) driver 447, which provides a voltage on a word line selected during a program or read operation, a driver 447a for unselected data word lines, and a dummy word line driver 447b which provides voltages on dummy word lines.

The voltage sources can also include a common SGS driver 445 and separate SGD drivers for each sub-block. For example, SGD drivers 446, 446a, 446b and 446c can be provided for SB0, SB1, SB2 and SB3, respectively. In another option, a separate SGS driver is provided for each sub-block.

The various components, including the row decoder, may receive commands from a controller such as the state machine 112 or the controller 122 to perform the functions described herein.

A source line voltage source 430 provides the voltage Vsl to the source lines/diffusion region in the substrate via control lines 432. In one approach, the source diffusion region 433 is common to the blocks. A set of bit lines 442 is also shared by the blocks. A bit line voltage source 440 provides voltages to the bit lines.

Figure 5:
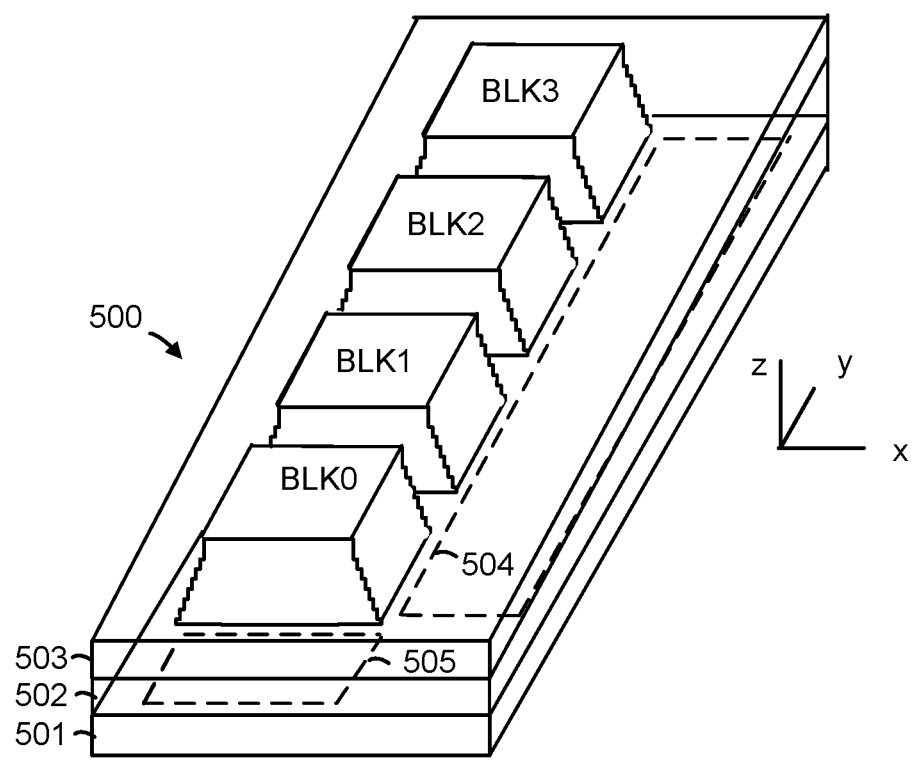
FIG. 5 is a perspective view of a memory device 500 comprising a set of blocks in an example 3D configuration of the memory structure 126 of FIG. 1.

FIG. 5 is a perspective view of a memory device 500 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The pass transistors for a voltage driver of the SGS transistors may be located in this peripheral area 505, in one approach. In this case, the blocks BLK0, BLK1, BLK2 and BLK3 are at progressively further distances from the pass transistors. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 6A:
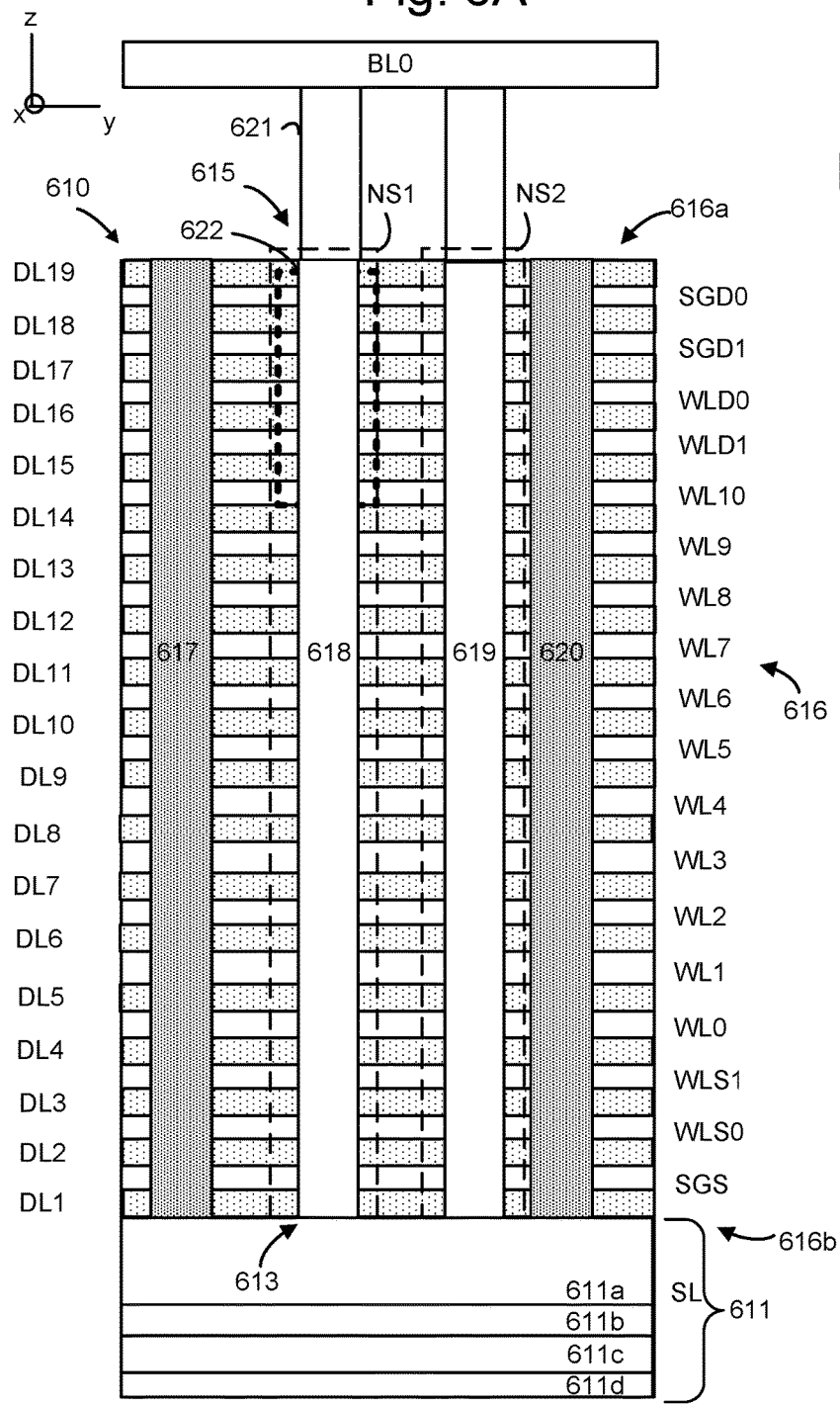
FIG. 6A depicts an example cross-sectional view of a portion of one of the blocks of FIG. 5.

FIG. 6A depicts an example cross-sectional view of a portion of one of the blocks of FIG. 5. The block comprises a stack 610 of alternating conductive and dielectric layers. In this example, the conductive layers comprise two SGD layers, one SGS layer, two source-side dummy word line layers (or word lines) WLS1 and WLS0, two drain-side dummy word line layers WLD1 and WLD0, and eleven data word line layers (or data word lines) WL0-WL10. WL0 is a source-side data word line and WLS1 is a dummy word line layer which is adjacent to the source-side data word line. WLS0 is another dummy word line layer which is adjacent to WLS1. WL10 is a drain-side data word line and WLD1 is a dummy word line layer which is adjacent to the drain-side data word line. WLD0 is another dummy word line layer which is adjacent to WLD1. The dielectric layers are labelled as DL1-DL19. Further, regions of the stack which comprise NAND strings NS1 and NS2 are depicted. Each NAND string encompasses a memory hole 618 or 619 which is filled with materials which form memory cells adjacent to the word lines. Region 622 of the stack is shown in greater detail in FIG. 6C.

The stack includes a substrate 611. In one approach, a portion of the source line SL comprises an n-type source diffusion layer 611a in the substrate which is in contact with a source end of each string of memory cells in a block. An erase voltage may be applied to this layer in an erase operation The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

Figure 6B:
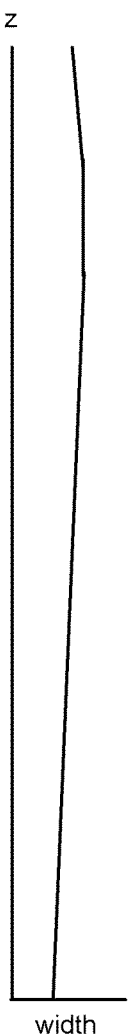
FIG. 6B depicts an example variation in the width of the memory holes of FIG. 6A along their height.

FIG. 6B depicts an example variation in the width of the memory holes of FIG. 6A along their height. Due to the etching process used to create the memory holes, and the very high aspect ratio, the cross-sectional width, e.g., diameter, of a memory hole can vary along its height. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the corresponding width of the vertical pillar which is formed in the memory hole, the programming and erase speed of the memory cells can vary based on their position along the memory hole, e.g., based on their height in the stack. With a smaller diameter memory hole, the electric field across the tunneling layer is stronger, so that the programming and erase speed is higher.

In this case, the memory cells are arranged along vertically-extending memory holes in the memory device, and a width of the vertically-extending memory holes varies along a height of the memory device. Further, this example shows that the memory hole is created by etching through the stack of layers which include word line layers and select gate layers. In one variation, the word line layers are etched through before the SGD layers are deposited and subsequently etched through separately. In another variation, one set of word line layers is deposited and etched through, then another set of word line layers is deposited and etched through. The memory hole diameter can differ from that shown in these different variations.

FIG. 6C depicts a close-up view of the region 622 of the stack of FIG. 6A. Memory cells are formed at the different levels of the stack at the intersection of a word line layer and a memory hole. In this example, SGD transistors 718 and 717 are provided above dummy memory cells 716 and 715 and a data memory cell 714. A number of layers can be deposited along the sidewall (SW) of the memory hole 630 and/or within each word line layer, e.g., using atomic layer deposition. For example, each pillar 699 or column which is formed by the materials within a memory hole can include a blocking oxide layer 663, a charge-trapping layer 664 or film such as silicon nitride (Si3N4) or other nitride, a tunneling layer 665, a channel 660 (e.g., comprising polysilicon), and a dielectric core 666. A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string comprises a channel which extends continuously from one or more source-end select gate transistors to one or more drain-end select gate transistors.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

The movement of electrons in the channel during a read operation is discussed further in connection with FIG. 11A.

Figure 7:
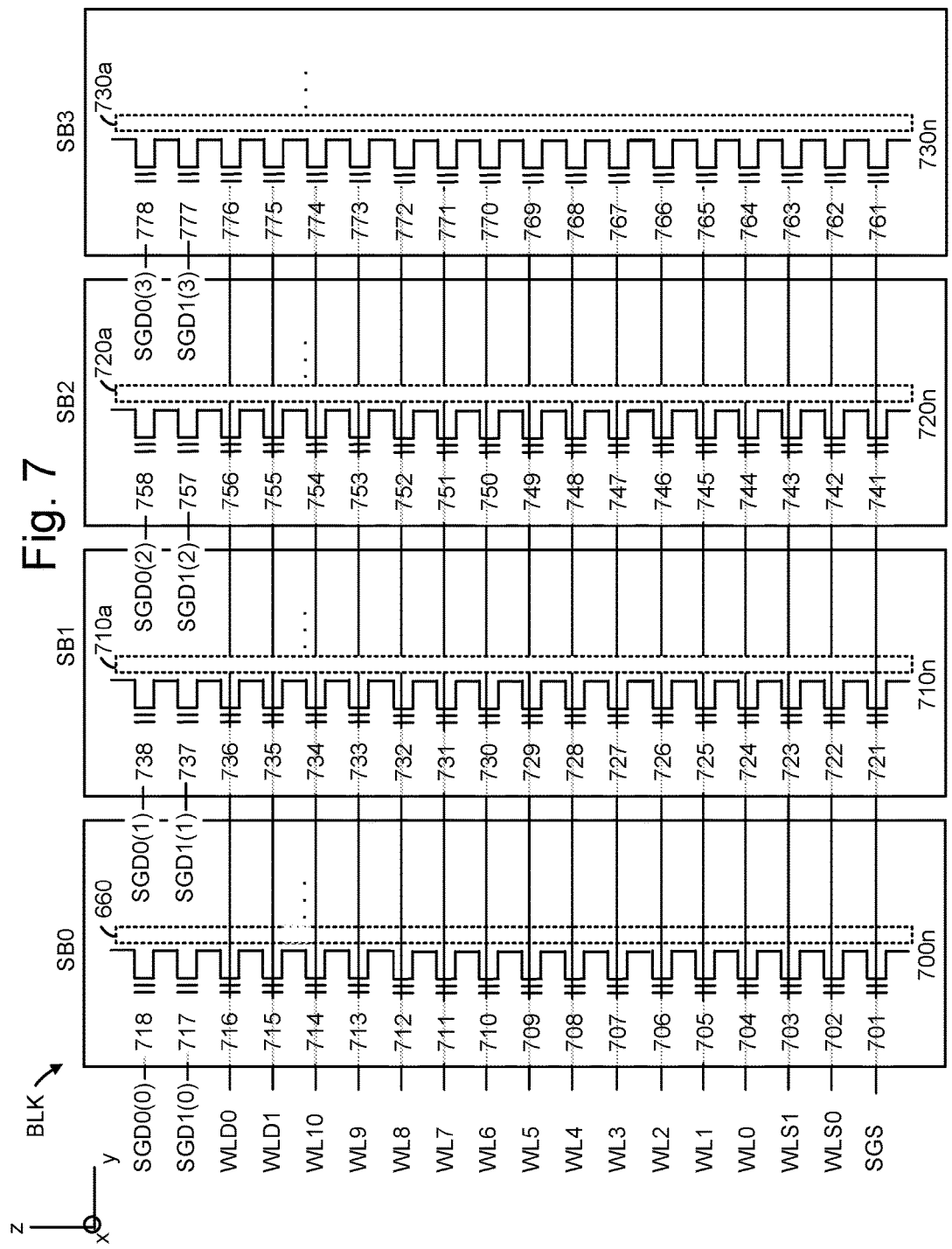
FIG. 7 depicts an example view of NAND strings in sub-blocks in a 3D configuration which is consistent with FIGS. 6A and 6C.

FIG. 7 depicts an example view of NAND strings in sub-blocks in a 3D configuration which is consistent with FIGS. 6A and 6C. A NAND string is one example of a set of connected memory cells such as series-connected memory cells. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line. For simplicity, only one NAND string per sub-block is depicted in FIG. 7. Programming of the block may occur based on a word line programming order. Moreover, one option is to program the memory cells in different portions of a word line which are in the different sub-blocks, one sub-block at a time, before programming the memory cells of the next word line. Another option programs all of the memory cells in one sub-block, one word line at a time, before programming the memory cells of the next sub-block. The word line programming order may start at WL0, the source-end word line, and end at WL10, the drain-end word line, for example.

The NAND strings 700n, 710n, 720n and 730n have channels 660 (FIG. 6C), 710a, 720a and 730a, respectively.

Additionally, NAND string 700n includes SGS transistor 701, source-side dummy memory cells 702 and 703, data memory cells 704, 705, 706, 707, 708, 709, 710, 711, 712, 713 and 714, drain-side dummy memory cells 715 and 716, and SGD transistors 717 and 718.

The memory cell 714 is an example of an edge data memory cell at the drain end of a NAND string, and the memory cell 704 is an example of an edge data memory cell at the source end of a NAND string.

NAND string 710n includes SGS transistor 721, source-side dummy memory cells 722 and 723, data memory cells 724, 725, 726, 727, 728, 729, 730, 731, 732, 733 and 734, drain-side dummy memory cells 735 and 736, and SGD transistors 737 and 738.

NAND string 720n includes SGS transistor 741, source-side dummy memory cells 742 and 743, data memory cells 744, 745, 746, 747, 748, 749, 750, 751, 752, 753 and 754, drain-side dummy memory cells 755 and 756, and SGD transistors 757 and 758.

NAND string 730n includes SGS transistor 761, source-side dummy memory cells 762 and 763, data memory cells 764, 765, 766, 767, 768, 769, 770, 771, 772, 773 and 774, drain-side dummy memory cells 775 and 776, and SGD transistors 777 and 778.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 are driven by a common control line SGS, in one approach. In another possible approach, the SGS transistors in SB0, SB1, SB2 and SB3 may be driven by separate control lines.

Figure 8A:
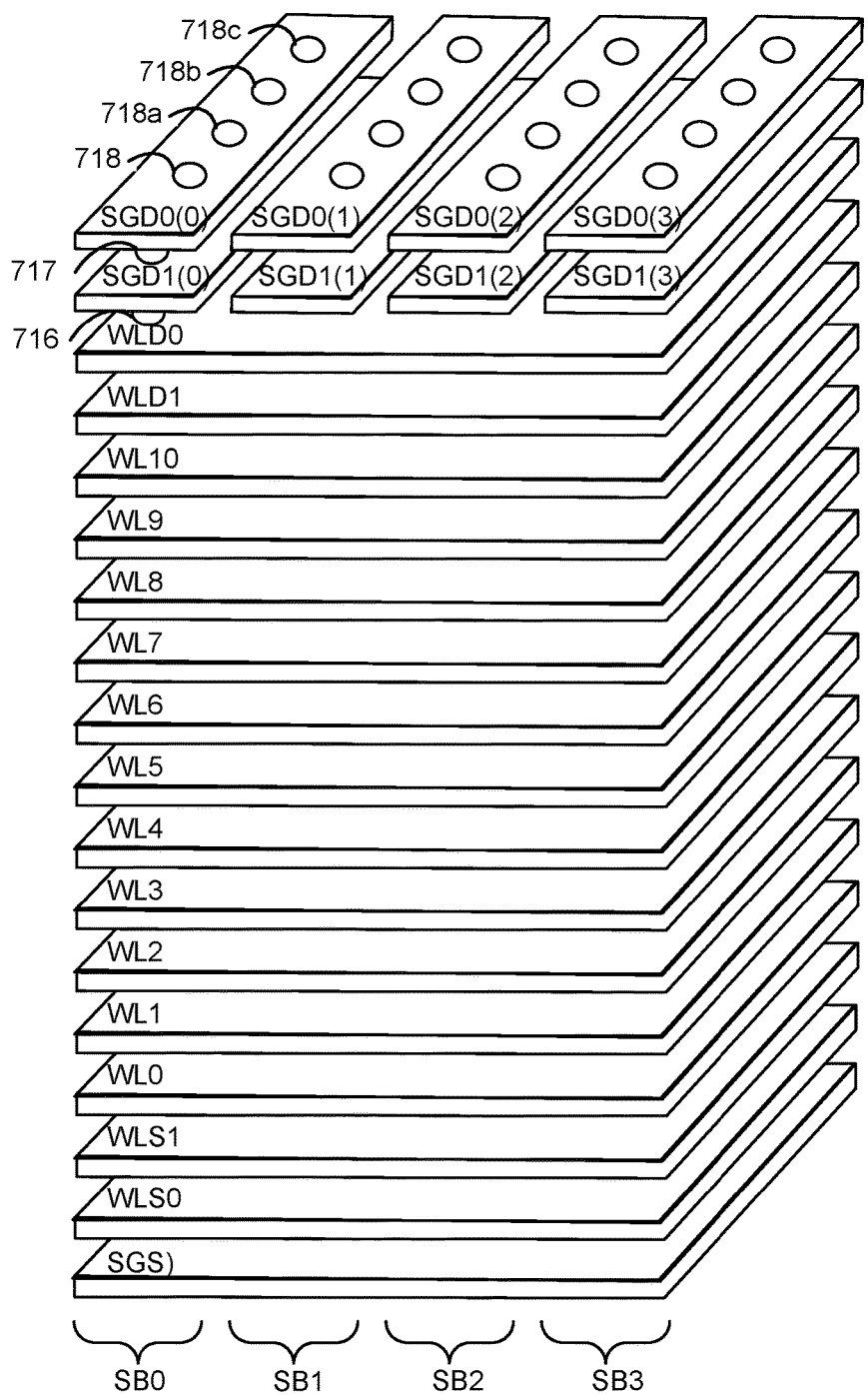
FIG. 8A depicts control gate layers in a stack consistent with FIG. 7.

FIG. 8A depicts control gate layers in a stack consistent with FIG. 7. The control gate layers include dummy word lines layers WLS0, WLS1, WLD0 and WLD1, and data word line layers WL0-WL10, which are shared among the different sub-blocks SB0-SB3. The control gate layers include the common SGS control gate layer for a block and separate SGD control gate layers for each sub-block. For example, SB0 includes SGD0(0) and SGD1(0), SB1 includes SGD0(1) and SGD1(1), SB2 includes SGD0(2) and SGD1(2), and SB3 includes SGD0(3) and SGD1(3). Additionally, four example memory holes are depicted in each sub-block. SGD transistors 718, 718a, 718b and 718c are depicted in SGD0(0), SGD transistor 717 is depicted in SGD1(0) and dummy memory cell 716 is depicted in WLD0.

FIG. 8B depicts additional detail of the sub-blocks SB0-SB3 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sense circuits may be connected to each bit line. For example, sense circuits 180, 181, 182 and 183 of FIG. 2 are connected to bit lines BL0, BL1, BL2 and BL3.

Programming and reading can occur for selected cells in one word line and one sub-block at a time. This allows each selected cell to be controlled by a respective bit line and/or by the source line. For example, a set of memory cells 801, which includes an example memory cell 847, is connected to WL10 in SB0. This is the drain-end data word line. WL0 is the source-end data word line. A set of memory cells may be programmed or read concurrently. An additional set of memory cells is connected to WL10 in each of the other sub-blocks SB1-SB3. For example, a set of memory cells 820, which includes an example memory cell 857, is connected to WL10 in SB1.

In this example, the source line SL or source region is driven at a voltage Vsl by the source line voltage source 430.

Each NAND string includes one or more SGD transistors at the drain-end and one or more SGS transistors at the source end. In this case, there are two SGD transistors and one SGS transistor per string. Each SGD transistor may be connected to separate control line layer, as in FIG. 8A, so that it can be driven separately, or the two or more SGD transistors in a string may have their control gates connected and commonly driven. For example, SB0 has sets of SGD transistors 840 and 839, with example SGD transistors 718 and 717, respectively, in the NAND string 700n. The set of SGD transistors 840 also includes an example SGD transistor 719 in the NAND string 701n. SB0 also has a set of SGS transistors 843, with an example SGS transistor 701 in the NAND string 700n. Similarly, SB1 has sets of SGD transistors 860 and 849, with example SGD transistors 738 and 737, respectively, in the NAND string 710n. SB1 also has a set of SGS transistors 853, with an example SGS transistor 721 in the NAND string 710n.

The NAND string 700n includes SGD transistors 718 and 717 connected to select gate control lines SGD0(0) and SGD1(0), respectively, dummy memory cells 716 and 715 connected to WLD0 and WLD1, respectively, and data memory cells 714 and 713 connected to WL10 and WL9, respectively. The NAND string 710n includes SGD transistors 738 and 737 connected to select gate control lines SGD0(1) and SGD1(1), respectively, dummy memory cells 736 and 735 connected to WLD0 and WLD1, respectively, and data memory cells 734 and 733 connected to WL10 and WL9, respectively.

FIG. 9 depicts a voltage signal used in a series of program loops in an example program operation. The horizontal axis denotes a program loop number, ranging from 1-22, and the vertical axis denotes voltage. During a program operation, program loops are performed for a selected word line in a selected block in each plane. A program loop comprises a program portion in which a program voltage or pulse is applied to the selected word line followed by a verify portion in which a verify signal is applied to the selected word line while one or more verify tests are performed for the associated memory cells. Other than the erased state, each assigned state has a verify voltage which is used in the verify test for the state in a program operation.

The voltage signal 900 includes a series of program voltages, including an initial program voltage 901, which are applied to a word line selected for programming. In this example, the voltage signal includes program voltages which increase stepwise in amplitude in one or more program loops of a programming pass using a fixed or varying step size. This is referred to as incremental step pulse programming, where the program voltage starts at an initial level Vpgm_int (see program voltage 901) and increases in a step in each successive program loop, for instance, until the program operation is completed. A successful completion occurs when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 902, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification. More detailed examples of the verify signals are provided in FIGS. 12A and 14A.

All memory cells may initially be in the erased state at the beginning of the program operation, for instance. After the program operation is completed, a Vth distribution similar to that in FIG. 10 ideally is achieved, and the data can be read from the memory cells using read voltages which are between the Vth distributions. At the same time, a read pass voltage, Vpass (e.g., 8-10 V), also referred to as pass voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. See also FIG. 10. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

Figure 10:
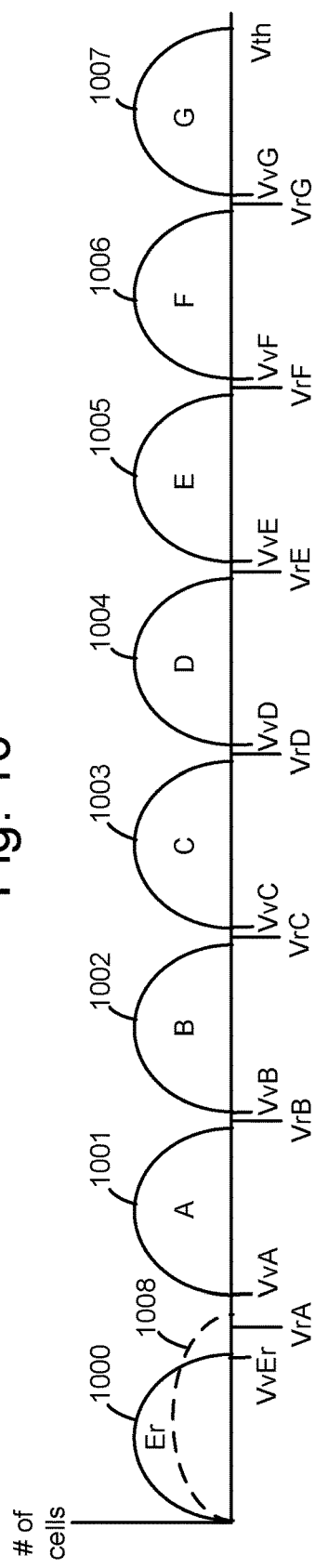
FIG. 10 depicts an example Vth distribution of sets of memory cells after a program operation.

FIG. 10 depicts an example Vth distribution of sets of memory cells after a program operation. The vertical axis depicts a number of memory cells, on a logarithmic scale, and the horizontal axis depicts a Vth of the memory cells on a linear scale. Eight data states are used, as an example. In one approach, at a start of the program operation, the memory cells are all initially in the erased state as represented by the Vth distribution 1000. After the program operation is successfully completed, the memory cells assigned to the Er state are represented by the Vth distribution 1008. The Vth distribution is upshifted due to some amount of program disturb which normally occurs.

The memory cells which are to be programmed to the A, B, C, D, E, F and G states using verify voltages of VvA, VvB, VvC, VvD, VvE, VvF and VvG, respectively, are represented by the Vth distributions 1001, 1002, 1003, 1004, 1005, 1006 and 1007, respectively. Read voltages VrA, VrB, VrC, VrD, VrE, VrF and VrG can be used for reading the states of the memory cells in a read operation. These verify voltages and read voltages are examples of control gate read levels of the selected word line voltage.

The Vth distribution 1008 of the erase state shows the effects of hot electron injection (HEI) type of read disturb. HEI disturb involves inadvertent programming of unselected memory cells adjacent to a selected word line due to voltage gradients in the channels of the NAND strings of the unselected memory cells. The disturb results in a Vth upshift for a memory cell and is strongest for erased state memory cells. The disturb is proportional to the magnitude and duration of the voltage gradient. See also FIG. 11A to 11E.

FIG. 11A depicts a plot of the NAND string 700n of FIG. 7, showing the movement of electrons during a read operation which cause a disturb. The NAND string includes the select gate transistors, data and dummy memory cells and channel 660 discussed in connection with FIGS. 6C and 7. The NAND string further includes the blocking oxide layer 663, charge-trapping layer 664 and tunneling layer 665 of FIG. 6C. WL4 is the selected word line (WLn) as an example. A set 1110 of source-side word lines is on the source side of WLn and a set 1111 of drain-side word lines is on a drain side of WLn. A region 1100 of the channel extends adjacent to SGS, a region 1101 of the channel extends adjacent to WLS0-WL3, a region 1102 of the channel extends adjacent to WL5-SGD0(0), and a region 1103 of the channel extends adjacent to SGD1(0) and SGD0(0).

FIG. 11B depicts a table showing control gate voltages of the memory cells and select gate transistors in FIG. 11A, (1a) before a read operation when the control gate voltages are floating and there is a first read situation, (1b) before a read operation when the control gate voltages are floating and there is a second read situation, (2) at a start of the read operation when the control gate voltages are at 0 V and (3)

after the control gate voltages are increased to a level used for sensing. The table also lists the voltages Vsl and Vbl.

Row (1a) indicates that, in the first read situation, before a read command is issued, the word voltages will be floated at a relatively low level, such as 0 V. This time may be an idle time of the memory device. The SGS control gate voltage can also be floated. This provides a simpler circuit implementation compared to the option of driving the SGS control gate voltage at 0 V. Generally, the SGS transistor will be non-conductive when it is floating during this idle time. However, the SGD control gate voltage may be driven at 0 V to avoid any possible leakage current through the unselected blocks.

Row (1b) indicates that, in the second read situation, before a read command is issued, the word voltages will be floated at a relatively high level, such as 4 V. In either situation, the SGD voltages may be driven at 0 V, and the SGS voltage may be floated, in one approach. When SGD1 (0) is driven at 0 V, a channel region 1106 which is between WLD0 and SGD1(0) can be cutoff, assuming the transistor 717 has a Vth>0 V.

Row (2) indicates that when a read command is initially issued, the word line voltages and SGS voltage will be driven at 0 V rather than being floated. Row (3) indicates that the unselected word line voltages and the select gate transistor voltages will subsequently be driven higher, from 0 V to a pass voltage level of Vsg_pass, e.g., 6-8 V, for the select gate transistors, or Vpass, e.g., 8-10 V, for the memory cells. The selected word line voltage will be driven from 0 V to Vcgr, the read level. Vcgr and the pass voltages can be maintained during the sensing of the conductive state of the selected memory cells.

In FIG. 11C to 11E, the column headings of 1100, 1101, 1102 and 1103 represent the channel regions in FIG. 11A. As explained in connection with FIG. 12A to 12D, the voltages of the channel regions typically return to a level close to 0 V after a sensing operation, while the word line voltages can float at a positive level, Vwl_coupled_up, before decaying back to about 0 V. The second read situation exists when the word line voltages are at Vwl_coupled_up and the first read situation exists when the word line voltages are at 0 V.

FIG. 11C depicts a table showing voltages in the channel 660 of FIG. 11A for the case of a first read situation without an SGD control gate voltage pulse, consistent with FIG. 11B, rows 1a, 2 and 3. Row (1) corresponds to the case of the control gate voltages of row (1a) of FIG. 11B. The channel regions 1100, 1101 and 1102 are at 0 V, and the channel region 1103 is at 1 V.

Referring to row (2), which corresponds to the case of the control gate voltages of row (2) of FIG. 11B, the channel regions 1100, 1101, 1102 and 1103 are at 0 V, −4 V, 0 V and 1 V, respectively. When the word line voltages are driven at 0 V at the start of a read operation, the channel region 1105 which is between WLn−1 (WL3) and WLn (WL4) can be cutoff, assuming the memory cell 708 is programmed to a data state with a Vth>0 V. Similarly, when SGS is driven at 0 V, a channel region 1104 which is between SGS and WLS0 can be cutoff, assuming the transistor 701 has a Vth>0 V. The channel region 1104 may remain in a cutoff state which existed when SGS control gate voltage was floating before the read command was issued. The channel region 1101 can also be down coupled to −4 V, for example. Specifically, if the memory cell 708 has Vth=4 V, for example, the application of 0 V on the word line WL4 results in a voltage of about −4 V (the control gate voltage minus the Vth) at the source side of the memory cell 708 and in the channel region 1101. We can assume the other data memory cells are in any random data state.

Due to the cutoff at the channel regions 1104 and 1105, the voltage in the channel region 1101 floats. Similarly, due to the cutoff at the channel regions 1105 and 1106, the voltage in the channel region 1102 floats.

Referring to row (3), which corresponds to the case of the control gate voltages of row (3) of FIG. 11B, the channel regions 1100, 1101, 1102 and 1103 are at 0 V, 0 V, 8 V and 1 V, respectively. When the word line voltages are ramped up from 0 V to Vpass, this capacitively couples up the channel region 1102 to 8 V (0 V+8 V). Moreover, the channel region 1104 is no longer cutoff due to an increase in the control gate voltage for SGS from 0 V to Vsg_pass. As a result, the channel region 1101 is driven by Vsl=0 V and not floated.

The channel region 1101 is therefore not coupled up in the same way as the channel region 1102. The channel region 1103 continues to be driven at Vbl=1 V, for example. With 8 V in the channel region 1102 on the drain side of WLn and 0 V in the channel region 1101 on the source side of WLn, there is a channel gradient of 8−0=8 V in the channel adjacent to WLn. The channel gradient generates electron-hole pairs, where the electrons (such as example electron 1107) can be drawn into the charge trapping layer 664 adjacent to WLn+1 (WL5). This causes a disturb of the memory cell 709 such as depicted in FIG. 10 (Vth distribution 1008).

A goal of the techniques described herein is to reduce the voltage in the channel region 1102 on the drain side of WLn by controlling the voltage of the SGD select gate transistors.

FIG. 11D depicts a table showing voltages in the channel 660 of FIG. 11A for the case of a second read situation without an SGD control gate voltage pulse, consistent with FIG. 11B, rows 1b, 2 and 3. Row (1) has the same values as row (1) in FIG. 11C for the reasons mentioned previously. The channel regions 1100, 1101 and 1102 are at 0 V, and the channel region 1103 is at 1 V.

Row (2) has the same values as row (2) in FIG. 11C for the reasons mentioned previously, except the channel region 1102 is down coupled to −4 V due to the transition of the word line voltages from the floating level of 4 V to the driven level of 0 V. In contrast, in the first read situation, there is little or no change in the voltage of the channel region 1102 when the word line voltages transition from floating to being driven at 0 V.

Row (3) has the same values as row (2) in FIG. 11C for the reasons mentioned previously, except the channel region 1102 is coupled up to 4 V (−4 V+8 V) due to the capacitive coupling from the voltage swing of the unselected word lines.

With 4 V in the channel region 1102 on the drain side of WLn and 0 V in the channel region 1101 on the source side of WLn, there is a channel gradient of 4−0=4 V in the channel adjacent to WLn. The channel gradient and the corresponding disturb of the memory cell 709 is therefore significantly reduced compared to the first read situation of FIG. 11C.

In FIG. 11C to 11E, in row (3), the voltages which determine the channel gradient are bolded and underlined.

FIG. 11E depicts a table showing voltages in the channel 660 of FIG. 11A for the case of a first read situation with an SGD control gate voltage pulse, consistent with FIG. 11B, rows 1a, 2 and 3. The SGD control gate voltage pulse, discussed further, e.g., in connection with FIGS. 14A to 14F and 15A to 15C, advantageously results in the reduced disturb of the second read situation (FIG. 11D), but when the first read situation is present.

Row (1) has the same values as row (1) in FIG. 11C for the reasons mentioned previously. The channel regions 1100, 1101 and 1102 are at 0 V, and the channel region 1103 is at 1 V.

Row (2) has the same values as row (2) in FIG. 11C for the reasons mentioned previously.

Row (3) has the same values as row (2) in FIG. 11D. This is achieved by reducing the amount of coupling up of the channel region 1102 during the increase of the voltages of the unselected word lines, by temporarily providing the SGD transistor or transistors in a conductive state. With 4 V in the channel region 1102 on the drain side of WLn and 0 V in the channel region 1101 on the source side of WLn, there is a channel gradient of 4−0=4 V in the channel region adjacent to WLn. The channel gradient and the corresponding disturb of the memory cell 709 is therefore significantly reduced compared to the first read situation of FIG. 11C, which does not use the SGD control gate voltage pulse.

The coupling up of the channel region 1102 during the increase of the unselected word line voltages relies on the fact that the channel region is floating. By temporarily providing the SGD transistor or transistors of an unselected NAND string in a conductive state using an SGD control gate voltage pulse, the channel region 1102 is temporarily prevented from floating and is instead connected to the bit line. In this example, a reduced amount of coupling up occurs which can avoid the HEI type of read disturb. Some channel boosting can remain as this may be desirable for reducing normal read disturb, which is caused by weak Fowler-Nordheim (F-N) tunneling due to a large voltage difference between the control gate and a channel of a memory cell.

Moreover, the magnitude and/or duration of the SGD control gate voltage pulse can be optimized based on the time since the last sensing operation and/or the temperature, to provide an optimum amount of channel boosting which combats both HEI disturb and normal read disturb.

In some cases, a larger duration or magnitude for the SGD control gate voltage pulse can increase the overall time for the read operation, due to the time used to set up and recover from the voltage pulse. In these cases, providing the larger duration or magnitude for the SGD control gate voltage pulse when there is an indication of a likelihood of HEI disturb, but not at other times, can avoid unnecessary increases in the overall time of the read operation.

FIG. 12A depicts a plot of example waveforms in a program operation, showing coupling up of a word line voltage. The coupling up can occur for data and dummy word lines after a sensing operation which occurs, e.g., as part of a program or read operation. The coupling up can be up to about 4 V, for instance. The coupling up occurs while the word line voltages are floating. FIGS. 12A and 12B describe the coupling up which occurs after the verify portion of a program operation and FIGS. 12C and 12D describe the coupling up which occurs after a read operation.

The time period shown represents one program-verify iteration or loop. The horizontal axis depicts time and the vertical axis depicts word line voltage, Vwl. A program voltage 1200 is applied to a selected word line from t0-t4 and reaches a magnitude of Vpgm. The program voltage can temporarily pause at an intermediate level such as Vpass to avoid a single large transition which can have undesired coupling effects. A pass voltage 1205 is applied to the unselected word lines from t0-t19 and reaches a magnitude of Vpass, which is sufficiently high to provide the memory cells in a conductive state so that the sensing (e.g., verify) operations can occur for the memory cells of the selected word line. The pass voltage includes an increasing portion, a fixed amplitude portion, for instance, at Vpass and a decreasing portion. Optionally, the pass voltage may be increased sooner relative to the program voltage so that Vpass is reached by t0.

A verify voltage 1210 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The sense circuits may be activated during each verify voltage. The waveform decreases from VvG to 0 V or other steady state level from t15-t16.

For the unselected word lines, including the dummy word lines, the decrease in Vpass will cause the memory cells to transition from a conductive state to a non-conductive state. In particular, when the Vpass falls below a cutoff level, Vcutoff (the dotted line at t18), the channel of the memory cell will become cutoff, e.g., the memory cell will become non-conductive. When a cell becomes non-conductive, it acts as a capacitor in which the control gate is one plate and the channel is another plate. A cell becomes non-conductive when Vcg<Vcutoff or Vcg<(Vth+Vsl), where Vcg is the control gate voltage of the memory cell (the word line voltage), Vth is the threshold voltage of the memory cell and Vsl is the source line voltage which in turn is approximately the voltage at the source terminal of the memory cell. For a cell in the highest programmed state, e.g., the G state, the Vth can be as low as VvG and as high as the Vth at the upper tail of the G state in the Vth distribution 1007 in FIG. 10. Vcutoff can therefore be as low as VvG+Vsl or as high as Vth of the G state upper tail+Vsl. As the pass voltage 1205 decreases from Vcutoff to 0 V, the channel is capacitively coupled down by a similar amount, as represented by plot 1215 in FIG. 12B.

The voltage swing while the channel is cutoff will be larger when Vsl is larger. However, since Vch=Vsl, the minimum downcoupled level of Vch will be essentially independent of Vsl. For example, a 6 V swing in the word line voltage (e.g., Vcutoff=6 V) with Vsl=1 V will result in about the same minimum downcoupled level of Vch as a 5 V swing in the word line voltage (e.g., Vcutoff=5 V) with Vsl=0 V.

The plot 1212 represents one example of the coupling up of the word line voltages from t19-t20. The coupling up is depicted as occurring relatively quickly but this is not to scale. In practice, the verify operation, e.g., from t5-t19, may consume about 100 microseconds, while the coupling up of the word line may be significantly longer, in the millisecond range such as 10 milliseconds. This example assumes the word line voltage has reached its intended minimum ramped down level of Vss=0 V, for instance. When Vwl is subsequently coupled up, it reaches a maximum level of Vwl_coupled_up and the block is in the second read situation. Vwl gradually discharges back to 0 V over a period of several minutes to return the block to the first read situation.

FIG. 12B depicts a plot of a channel voltage (Vch) corresponding to FIG. 12A. Vch for an unselected NAND string (a string not having a cell which is programmed in the current program loop), will be boosted to a level such as 8 V (not shown) during the program voltage, e.g., from t0-t4. This boosting is achieved by providing the SGD and SGS transistors of the unselected string in a non-conductive state to cause Vch to float. Vch is coupled higher due to capacitive coupling when Vpass and Vpgm are applied to the word lines. For a selected NAND string (a string having a cell which is programmed in the current program loop), Vch is typically grounded as shown during the program voltage.

During the verify voltages, Vch may be initially at about 1 V, for instance, for a selected NAND string. Vch is about the same as Vsl for the channels of the selected NAND strings. Vsl is set based on a type of sensing which is used. Examples include negative sensing in which Vsl is about 1 V and positive sensing in which Vsl is about 0 V and a negative word line voltage is used. The techniques described herein apply regardless of the level of Vsl or the type of sensing used.

The channel is capacitively coupled down to a minimum level from t18-t19 and then begins to return to a final level of, e.g., 0 V from t19-t20. If the voltages of the word lines are allowed to float starting at t19, the voltages (plot 1212) are capacitively coupled higher by the increase in Vch. In one example, the voltages of the word lines float to a peak level of Vwl_coupled_up (plot 1212), e.g., about 4 V. For example, Vcutoff may be 6 V, so that there is a 6 V change in the word line voltage, e.g., 6-0 V, which is coupled to the channel. With the initial value of Vch at 1 V and a 90% coupling ratio, the minimum Vch may be about 1-6× 0.9=−4.4 V, for instance. Accordingly, as Vch returns to 0 V, there is a 4.4 V increase in Vch which is coupled to the word line, e.g., control gate, of the memory cells. By applying the 90% coupling ratio to this coupling up, Vwl_coupled_up may be about 4.4×0.9=4 V. The voltages of the word lines are floated by disconnecting the word lines from a word line driver.

The channel voltage of plot 1215 correspond to the word line voltages of plots 1212 after t19.

FIG. 12C depicts a plot of example waveforms in a read operation, showing coupling up of a word line voltage. A read operation is similar to a verify operation as both are sensing operations and both can provide a coupling up of the word line voltages. The horizontal axis depicts time and the vertical axis depicts word line voltage, Vwl. Pass voltages of plots 1230, 1231 and 1232 are applied to the unselected word lines from t0-t3, t4-t8 and t9-t12, respectively, and have a magnitude of Vpass. The pass voltage includes an increasing portion, a portion at Vpass and a decreasing portion. A read voltage includes separate waveforms 1220 (at levels of VrA and VrE), 1221 (at levels of VrB, VrD and VrF) and 1222 (at levels of VrC and VrG) for each of the lower, middle and upper pages, respectively, consistent with FIG. 10. The read voltages are applied to the selected word line. An eight-level memory device is used in this example.

For the unselected word lines, the decrease in Vpass will cause the memory cells to transition from a conductive state to a non-conductive state, as discussed. The dotted line at t13 indicates when a G state cell becomes non-conductive. As the pass voltage 1232 decreases from Vcutoff to 0 V, the channel is capacitively coupled down by a similar amount, as represented by the plot 1235 in FIG. 12D. As the channel voltage increases after t14, the word line voltages are floated and are coupled higher, to Vwl_coupled_up.

FIG. 12D depicts a plot of a channel voltage (Vch) corresponding to FIG. 12C. The channel is capacitively coupled down to a minimum level of Vch min from t13-t14 and then begins to return to a final level of, e.g., 0 V from t14-t15. If the voltages of the word lines are allowed to float starting at t14, the voltages (plot 1232) are capacitively coupled higher by the increase in Vch (plot 1235). The voltages of the word lines float to a peak level of Vwl_coupled_up, as discussed in connection with FIG. 12B.

FIG. 13 depicts a flowchart of an example read operation which reduces read disturb, consistent with the example of FIG. 11E. Step 1300 includes tracking a time since a last sense operation, e.g., using the timer 119 of FIG. 1A. Step 1301 includes detecting a power on event, e.g., using the power on detection circuit 117 of FIG. 1A. Step 1302 includes detecting a temperature, e.g., using the temperature-sensing circuit 115 of FIGS. 1A and 1B. Steps 1300 and/or 1301 can be used as inputs to step 1303, which involves tracking an indicator of a floating voltage of unselected word lines of a block. The indicator can be, for instance, the time of step 1300 or the detection of step 1301. Step 1304 includes receiving a read command for selected NAND strings and a selected word line of a selected sub-block (e.g., SB0) of a block. The command can be issued by a host device, for instance, and received by the controller 122, for example.

In response to the read command, step 1305 includes determining a duration and a magnitude of an SGD control gate voltage pulse based on the indicator. See FIG. 16A to 16D, for example. The duration and magnitude can be an increasing function of the time of step 1300, for instance. Step 1306 includes determining a delay in an increase in the bit line voltage relative to an increase in the voltage of the unselected word lines, based on the indicator. The delay can be an increasing function of the time of step 1300, for instance. See also FIGS. 14B, 14F and 17. Step 1307 includes increasing a voltage of the unselected word lines to Vpass while applying an SGD control gate voltage pulse to the SGD transistors of the unselected NAND strings of an unselected sub-block (e.g., SB1-SB3). See also FIGS. 14B, 14D and 15A to 15C. Step 1308 includes applying Vsg_pass to the SGD transistors in the selected sub-block, to allow sensing of a current in the associated NAND strings to occur. Step 1309 includes setting bit line voltages at a level for sensing (e.g., Vbl_sense, FIG. 14E) in the selected sub-block. Step 1310 includes increasing a bit line voltage to an inhibit level for the unselected NAND strings in the unselected sub-block at a time which is based on the delay of step 1306. Step 1311 includes applying one or more values of Vcgr to the selected word line while sensing the conductive state of the selected memory cells. The sensing of the conductive state can involve deciding whether the memory cells are in a conductive or non-conductive state.

The process can suppress the injection type of read disturb which occurs during the first read operation on a cold block while still keeping the average time for the read operation as short as possible. The process can use a longer time for SGD control gate voltage pulse for the first read when read operation moves to a new block. The controller will keep a counter to record the time between two adjacent read operations. If this time interval is longer than a certain amount, the next read operation uses a longer SGD control gate voltage pulse regardless of whether or not the next read operation is on the same block as the last read operation.

If the next read operation remains on the same block as the last read operation, and the time elapsed since the last read is shorter than a specified time, a short SGD control gate voltage pulse is used for the next read operation to optimize the channel boosting level and to reduce the time of the read operation, in some embodiments. Additional read operations in the block will use the short SGD control gate voltage pulse as long as the time since the last read operation does not exceed the specified time. In this way, the longer SGD control gate voltage pulse is only used for the very first read operation on a potentially cold block. The injection type of read disturb which is caused by a cold read can therefore be avoided, while the average time of the read operation can still remain short.

In one approach, the indicator of step 1303 indicates a level of a floating voltage of the unselected word lines, and the SGD control gate voltage pulse of step 1307 limiting an increase in the boosting level of the channel of the unselected NAND string in preparation for sensing a selected memory cell.

FIG. 14A to 14F depicts example voltage signals in a read operation consistent with FIG. 13. The horizontal direction indicates a common time line with time points t0-t12 and the vertical direction denotes a voltage.

FIG. 14A depicts an example voltage signal for a selected word line (WL_sel). This example uses voltages at two demarcation levels, VrA and VrE. One or more demarcation levels may be used. The voltage signal is at Vss or 0 V from t0-t2, VrA from t2-t4, and VrE from t4-t6. In one option, the voltage is increased to a pass level (Vpass) from t7-t10 before being ramped down from Vpass to Vss at t10. This option can avoid channel gradients which can cause disturbs, by ramping down the selected word line and an adjacent unselected word line from the same level. If two adjacent word lines are ramped down from different levels, the channel gradient can occur. In another option, the voltage remains at VrE and is ramped down from VrE to Vss at t10.

FIG. 14B depicts an example voltage signal for unselected word lines (WL_unsel). The voltage increases from Vss to Vpass in a time period t0-t1, remains at Vpass until t10 and is ramped down from Vpass to Vss at t10. This voltage provides the unselected memory cells in a conductive state to allow sensing of the selected memory cells in each NAND string.

FIG. 14C depicts an example voltage signal for selected SGD transistors and for SGS transistors in a sensing process. The selected SGD transistors are in a selected sub-block in which a read operation occurs. The SGS transistors are commonly controlled in a block so that the SGS transistors in the selected and unselected sub-blocks have the same control gate voltage, in one embodiment. The read disturb problem occurs is this embodiment. The voltage is increased from Vss to Vsg_pass at t1, then ramped back down to Vss at t9, in one approach.

FIG. 14D depicts an example voltage signal for unselected SGD select gate transistors. The signal comprise an SGD control gate voltage pulse 1410 (or spike) which reduces the channel boosting level in the unselected NAND strings, as discussed. Note that the control gate voltage pulse can optionally be used on the SGS transistors as well as the SGD transistors. The control gate voltage pulse can have a specified duration and magnitude as discussed. See FIG. 15A to 15C for further details of example control gate voltage pulses.

FIG. 14E depicts example voltage signals for a bit line (BL). The selected NAND strings are in the selected sub-block and include a selected memory cell which is selected for sensing. A steady state voltage, e.g., Vss=0 V, is applied initially, and a sensing voltage, Vbl_sense, e.g., 2-3 V, is applied from t0-t6 (plot 1423), in one option. During sensing for each demarcation (read or verify) voltage, Vbl may remain relatively steady (plot 1420) or may decay during sensing of a selected NAND string. The case with a bit line decay is depicted by plots 1421 and 1422. If Vbl decays below a specified trip voltage, Vbl_trip, the selected memory string is considered to be in a conductive state and the Vth of the selected memory cell is below the demarcation voltage, in one embodiment. The determination of whether Vbl decays below Vbl_trip is made at t3 and t5 for sensing relative to VrA and VrE, respectively. If Vbl does not decay below Vbl_trip, the selected memory string is considered to be in a non-conductive state and the Vth of the selected memory cell is equal to or above the demarcation voltage. The bit line voltage is floated from t6-t9 and then ramped down to Vss at t9.

In another option, shown by plot 1424, the voltage for the bit line increases from Vss at t1, after the increase of WL_unsel. A control circuit may be configured to initiate an increase of a voltage of the bit line from an initial level to a higher level after initiating the increase of the voltage of the unselected word lines from the initial level to the read pass level.

FIG. 14F depicts an example voltage signal for a source line (SL) in a sensing process. The source line may remain at Vss, in one possible approach.

FIG. 15A depicts a detailed view of the voltage signal for unselected word lines of FIG. 14B from t0-t1. In FIG. 15A to 15C, the horizontal direction indicates a common time line with time points corresponding to t0-t1 in FIG. 14A to 14F, and the vertical direction denotes a voltage scale which is enlarged relative to FIG. 14A to 14F. There is a delay between the requested and actual output of a voltage driver when a change in voltage is requested by a controller. This delay is based on factors such as the resistance-capacitance (RC) time constant of the word line or select gate line which is being driven, and the capacity of the voltage driver. In this example, the requested voltage of WL_unsel changes from Vss to Vpass at t0, and the output voltage begins to increase, reaching Vpass at t1.

FIG. 15B depicts a detailed view of the voltage signal for unselected SGD select gate transistors of FIG. 14D from t0-t1. In this example, the requested voltage of SGD_unsel changes from Vss to a peak level, Vpeak, at t0, and the output voltage begins to increase. However, the requested voltage changes again, from Vpeak to Vss, at t0.2, before the output voltage can reach Vpeak. The output voltage of SGD_unsel instead reaches only Vpeak-Δ. Moreover, each unselected SGD transistor will be in a conductive state when the control gate voltage exceeds the Vth of the transistor, e.g., from t0.1 to t0.3, shown by an arrow 1510. When the SGD transistor is in a conductive state, the channel of the associated NAND string will not be boosted by capacitive coupling from the increase in the voltage of WL_unsel.

However, the period of time in which the SGD transistor is in a conductive state (t0.1-t0.3) is less than the period of time in which WL_unsel increases from Vss to Vpass (t0-t1). In particular, during the period of time t0.3-t1, the SGD transistor is in a non-conductive state so that the channel of the associated NAND string is boosted by capacitive coupling from the increase in the voltage of WL_unsel. As mentioned, some boosting of the channel can be useful to combat normal read disturb.

FIG. 15C depicts alternative voltage signals for unselected SGD select gate transistors. In these examples, the control gate voltage of SGD_unsel is allowed to reach the requested peak level, Vpeak1 or Vpeak2, and remain at that level for some time, during the increase of WL_unsel. In examples of plot 1513 and 1514, the voltage of SGD_unsel reaches Vpeak1 and Vpeak2<Vpeak1, respectively. The unselected SGD transistor is in a conductive state from t0.1 to t0.5 (arrow 1511) or from t0.1 to t1.1 (arrow 1512). Additionally, the request voltage of SGD_unsel can change from Vpeak1 or Vpeak2 to Vss at t0.4 (plot 1515), or from Vpeak1 to Vss at t1 (plot 1516). The on-time for the SGD transistor, represented by arrow 1511, is less than the period of time in which WL_unsel increases from Vss to Vpass (t0-t1) so that some channel boosting can occur in the time period of t0.4-t1. In contrast, the on-time for the SGD transistor represented by arrow 1512 is essentially the entire duration of the period of time in which WL_unsel increases from Vss to Vpass (t0-t1) so that little or no channel boosting can occur.

The plot 1516 will take some time to recover back to Vss, and this time can increase the overall read time. A longer duration should therefore be used selectively for the SGD control gate voltage pulse when the indicators of steps 1300-1302 of FIG. 13, for example, indicate there is an likelihood of HEI read disturb.

Providing a relatively higher magnitude for the SGD control gate voltage pulse can result in a relatively greater discharge of the channel, since the SGD transistor will be in a relatively stronger conductive state. That is, a greater overdrive of the SGD transistor allows more electrons to pass through the SGD transistor from the bit line to discharge the channel. The control gate voltage should not be too large or it could cause inadvertent programming of the SGD transistor.

In one approach, a control circuit can be configured to provide the control gate voltage pulse with a magnitude which is an increasing function of the time since a last sensing operation in the block. As mentioned, as this time increases, the block approach the first read situation in which a larger channel gradient can occur (see FIG. 11C). By providing a control gate voltage pulse with an appropriate magnitude and/or duration, the channel gradient, and the resulting likelihood of read disturb, can be reduced (FIG. 11E). See also FIG. 16A to 16D.

Figure 16A:
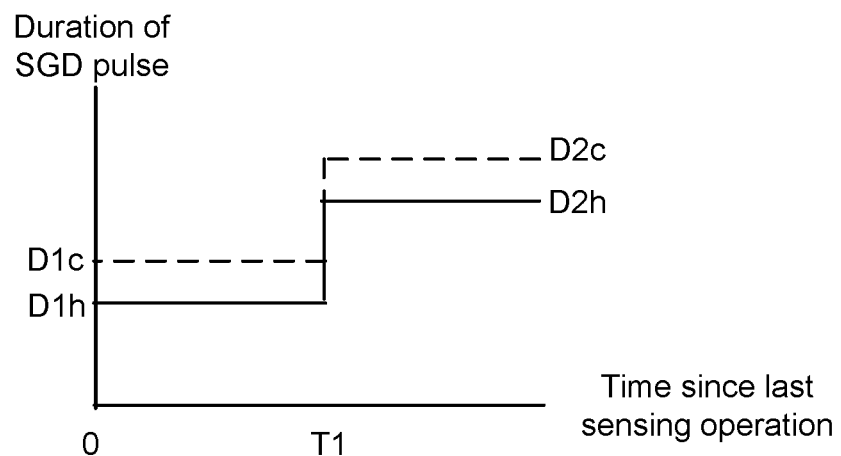
FIG. 16A depicts one example of a plot of a duration of an SGD control gate voltage pulse versus a time since a last sensing operation, for two different temperatures.

FIG. 16A depicts one example of a plot of a duration of an SGD control gate voltage pulse versus a time since a last sensing operation, for two different temperatures. It has been found that when an injection disturb occurs, it is strongest when the temperature is relatively low, such as below −15 to −30 degrees C. Accordingly, a control circuit can be configured to provide the control gate voltage pulse with a duration which is a decreasing function of the temperature, e.g., the duration is larger as the temperature is smaller or colder. The duration is also an increasing function of the time since the last sensing operation, e.g., the duration is larger as the time is greater.

In this example, a temperature T<−15 C is considered to be a cold temperature and T>−15 C is considered to be a hot temperature. When the time since the last sensing operation is less than a demarcation time T1, the duration of the SGD pulse is D1$c$ at a cold temperature or D1$h$ at a hot temperature, where D1$c$>D1$h$. The time T1 could be several minutes, for example. When the time since the last sensing operation is more than T1, the duration of the SGD pulse is D2$c$>D1$c$ at a cold temperature, or D2$h$>D1$h$ at a hot temperature, where D2$c$>D1$c$.

The dashed line represents the duration when the temperature is cold, and the solid line represents the lower duration when the temperature is hot. The duration of the SGD control gate voltage pulse is also greater when the time since the last sensing operation is greater.

This approach provides for a simplified implementation, because the duration is set at one of two levels for hot and cold temperatures. Other approaches are possible as well. For example, a ramp function or a multiple step function with more than two steps could be used. Moreover, the difference D1$c$–D1$h$ can be different than D2$c$–D2$h$.

Figure 16B:
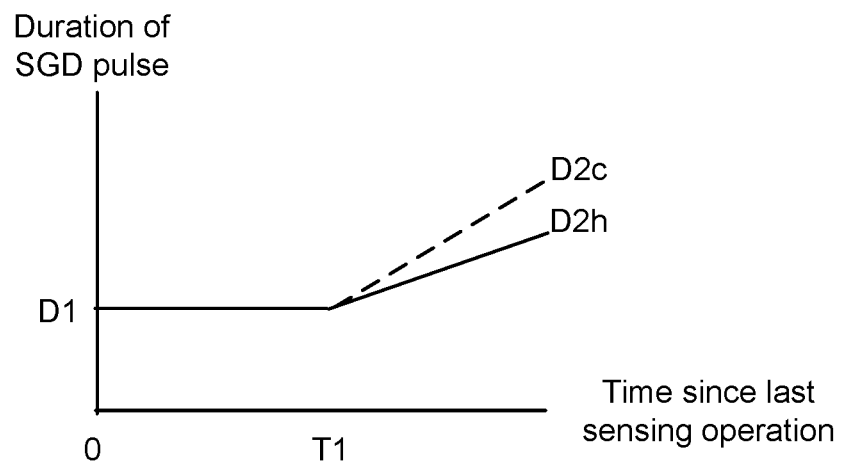
FIG. 16B depicts another example of a plot of a duration of an SGD control gate voltage pulse versus a time since a last sensing operation, for two different temperatures.

FIG. 16B depicts another example of a plot of a duration of an SGD control gate voltage pulse versus a time since a last sensing operation, for two different temperatures. In this example, there is one duration (D1) for a time less than T1, based on the theory that little or no read disturb will occur regardless of the temperature. Moreover, the duration increases in a ramp from D1 to D2$c$ for a cold temperature (dashed line) or to D2$h$ for a hot temperature. In another possible option, the SGD control gate voltage pulse is not used if the time since the last sensing operation is less than T1, based on theory that that little or no read disturb will occur even without the SGD control gate voltage pulse.

Figure 16C:
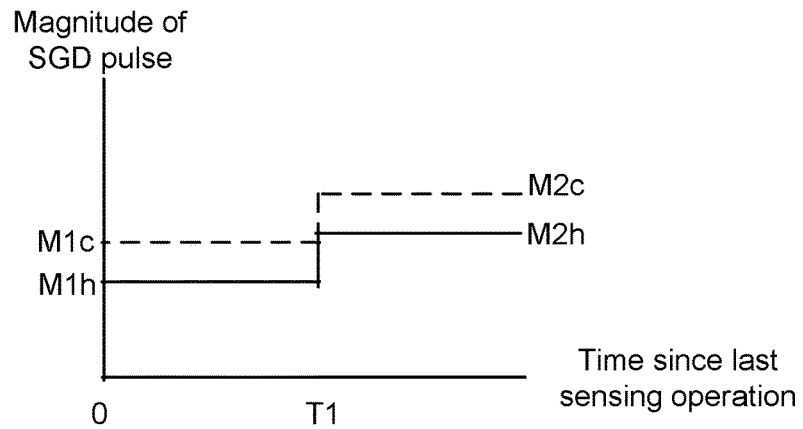
FIG. 16C depicts one example of a plot of a magnitude of an SGD control gate voltage pulse versus a time since a last sensing operation, for two different temperatures.

FIG. 16C depicts one example of a plot of a magnitude of an SGD control gate voltage pulse versus a time since a last sensing operation, for two different temperatures. As mentioned, a higher magnitude pulse can serve a similar purpose as a higher duration pulse in providing a relatively greater discharge of the NAND string channel. Additionally, temperature can be accounted for in setting the magnitude, similar to the approach of FIGS. 16A and 16B.

A control circuit can be configured to provide the control gate voltage pulse with a magnitude which is a decreasing function of the temperature, e.g., the magnitude is larger as the temperature is colder. The magnitude is also an increasing function of the time since the last sensing operation, e.g., the magnitude is larger as the time is greater.

When the time since the last sensing operation is less than T1, the magnitude of the SGD pulse is M1$c$ at a cold temperature or M1$h$ at a hot temperature, where M1$c$>M1$h$. When the time since the last sensing operation is more than T1, the magnitude of the SGD pulse is M2$c$>M1$c$ at a cold temperature or M2$h$>M1$h$ at a hot temperature, where M2$c$>M2$h$.

The dashed line represents the magnitude when the temperature is cold, and the solid line represents the lower magnitude when the temperature is hot. The magnitude of the SGD control gate voltage pulse is greater when the time since the last sensing operation is greater.

Other approaches are possible as well. For example, a ramp function or a multiple step function with more than two steps could be used. Moreover, the difference M1$c$–M1$h$ can be different than M2$c$–M2$h$.

A control circuit can be configured to provide the control gate voltage pulse with a magnitude which is an increasing function of the time. A control circuit can also be configured to provide the control gate voltage pulse with a magnitude which is a decreasing function of the temperature.

Figure 16D:
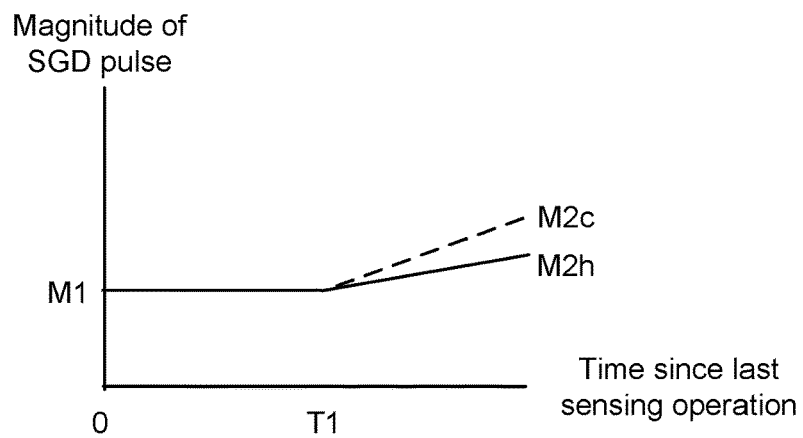
FIG. 16D depicts another example of a plot of a magnitude of an SGD control gate voltage pulse versus a time since a last sensing operation, for two different temperatures.

FIG. 16D depicts another example of a plot of a magnitude of an SGD control gate voltage pulse versus a time since a last sensing operation, for two different temperatures. There is one magnitude (M1) for a time less than T1, based on the theory that little or no read disturb will occur regardless of the temperature. Moreover, the magnitude increases in a ramp from M1 to M2$c$ for a cold temperature (dashed line) or to M2$h$ for a hot temperature.

Figure 17:
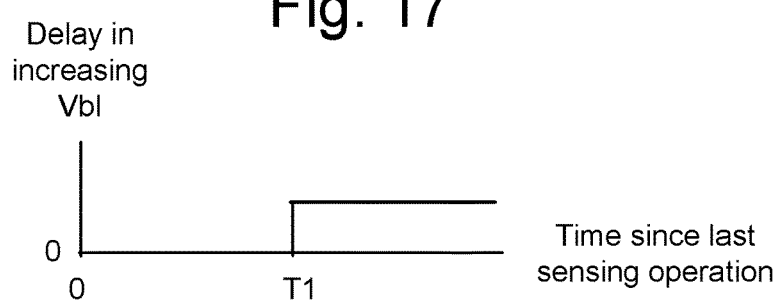
FIG. 17 depicts an example plot of a delay in increasing a bit line voltage, consistent with step 1306 of FIG. 13.

FIG. 17 depicts an example plot of a delay in increasing a bit line voltage, consistent with step 1306 of FIG. 13. As mentioned, delaying the increase in the bit line voltage, relative to the increase in the unselected word line voltages can increase the amount of channel discharge. This in turn reduces the channel gradient and the likelihood of a read disturb. In this example, no delay is used if the time since the last sensing operation is less than T1, while a delay is used if the time since the last sensing operation is greater than T1. Recall that FIG. 14E shows the option of increasing the bit line voltage starting at t1 rather than t0. The delay is therefore t1-t0. t0 is when the unselected word line voltages start to increase in FIG. 14B. Accordingly, while the unselected word line voltages are increasing, the bit line voltages are kept low to increase the amount of discharge of the channel. When the unselected word line voltages reach the final level of Vpass, the unselected word line voltages can increase to the elevated level used for sensing in a selected NAND string.

In some cases, a delay in the increase of the bit line voltage can increase the overall time of the read operation. By selectively delaying the increase of the bit line voltage when there is an increased risk of a disturb, and not delaying the increase at other times, any increase in the overall time can be minimized.

In one implementation, an apparatus comprises: a plurality of NAND strings in a block, each NAND string comprising a source-end select gate transistor, a drain-end select gate transistor, and memory cells between the source-end select gate transistor and the drain-end select gate transistor, wherein the plurality of NAND strings comprise a selected NAND string and an unselected NAND string; a selected word line connected to a selected memory cell in the selected NAND string and to an unselected memory cell in the unselected NAND string; unselected word lines connected to unselected memory cells in the selected NAND string and in the unselected NAND string; a tracking circuit configured to track an indicator of a floating voltage of the unselected word lines; and a control circuit. The control circuit configured to, in a read operation for the selected memory cell: increase a voltage of the unselected word lines from an initial level to a read pass level; during the increase, and in response to the indicator, provide a control gate voltage pulse for the drain-end select gate transistor in the unselected NAND string; and after the control gate voltage pulse, provide a voltage of the selected word line at a control gate read level while sensing the selected memory cell.

In another implementation, a method comprises: tracking a time since a last sensing operation in a block of memory cells, the memory cells are arranged in a selected NAND string and an unselected NAND string, each NAND string comprising a source-end select gate transistor, a drain-end select gate transistor, and memory cells between the source-end select gate transistor and the drain-end select gate transistor; and in response to a read command involving selected memory cells of the block, determining the time since the last sensing operation, increasing control gate voltages of unselected memory cells of the block to a read pass level, and providing a control gate voltage pulse for the drain-end select gate transistor in the unselected NAND string, where a duration of the control gate voltage pulse is an increasing function of the time.

In another implementation, an apparatus comprises: a plurality of NAND strings in a block, each NAND string comprising a source-end select gate transistor, a drain-end select gate transistor, and memory cells between the source-end select gate transistor and the drain-end select gate transistor, wherein the plurality of NAND strings comprise a selected NAND string and an unselected NAND string; a selected word line connected to a selected memory cell in the selected NAND string and to an unselected memory cell in the unselected NAND string; unselected word lines connected to unselected memory cells in the selected NAND string and in the unselected NAND string; means for indicating a level of a floating voltage of the unselected word lines; and means for limiting an increase in the boosting level in preparation for sensing the selected memory cell, the means for limiting is responsive to the means for indicating.

The means for indicating may include the power on detection circuit 117 and the timer 119 of FIG. 1A, or other logic hardware, and/or other executable code stored on a computer readable storage medium or device. Other embodiments may include similar or equivalent means.

The means for limiting may include the power control module 116, the control circuit 110, the controller 122, the temperature-sensing circuit 115, the SGD drivers 446-446a, or other logic hardware, and/or other executable code stored on a computer readable storage medium or device. Other embodiments may include similar or equivalent means.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a plurality of NAND strings in a block, each NAND string comprising a source-end select gate transistor, a drain-end select gate transistor, and memory cells between the source-end select gate transistor and the drain-end select gate transistor, wherein the plurality of NAND strings comprise a selected NAND string and an unselected NAND string;
a selected word line connected to a selected memory cell in the selected NAND string and to an unselected memory cell in the unselected NAND string;
unselected word lines connected to unselected memory cells in the selected NAND string and in the unselected NAND string;
a tracking circuit configured to track an indicator of a floating voltage of the unselected word lines; and
a control circuit, the control circuit configured to, in a read operation for the selected memory cell, where the indicator indicates whether the read operation is a first read of the block after a power on event for the block:
increase a voltage of the unselected word lines from an initial level to a read pass level;
during the increase, and in response to the indicator, provide a control gate voltage pulse for the drain-end select gate transistor in the unselected NAND string; and
after the control gate voltage pulse, provide a voltage of the selected word line at a control gate read level while sensing the selected memory cell.

2. The apparatus of claim 1, wherein:
the indicator indicates whether the unselected word lines are in a fully coupled up state, a discharged state or between the fully coupled up state and the discharged state.

3. The apparatus of claim 2, wherein:
the voltage of the unselected word lines is coupled up during a last sensing operation.

4. The apparatus of claim 1, wherein:
the indicator indicates a temperature; and
before providing the control gate voltage pulse, the control circuit is configured to determine a duration of the control gate voltage pulse, the duration is a decreasing function of the temperature.

5. The apparatus of claim 4, wherein:
the duration is lower when the temperature is below −15 degrees C. than when the temperature is above 15 degrees C.

6. The apparatus of claim 1, wherein:
the indicator indicates a temperature; and
before providing the control gate voltage pulse, the control circuit is configured to determine a magnitude of the control gate voltage pulse, the magnitude is a decreasing function of the temperature.

7. The apparatus of claim 1, wherein:
the control circuit is configured to provide the control gate voltage pulse with a duration which is greater when the read operation is the first read than when the read operation is not the first read.

8. The apparatus of claim 1, wherein:
the control gate voltage pulse has a magnitude which is sufficiently high to provide the drain-end select gate transistor in the unselected NAND string in a conductive state.

9. A method, comprising:
tracking a time since a last sensing operation in a block of memory cells, the memory cells are arranged in a selected NAND string and an unselected NAND string, each NAND string comprising a source-end select gate transistor, a drain-end select gate transistor, and memory cells between the source-end select gate transistor and the drain-end select gate transistor; and
in response to a read command involving selected memory cells of the block, determining the time since the last sensing operation and determining a duration of a control gate voltage pulse based on whether the time is greater than a demarcation time, increasing control gate voltages of unselected memory cells of the block to a read pass level, and applying a control gate voltage pulse having the determined duration to the drain-end select gate transistor in the unselected NAND string.

10. The method of claim 9, wherein:
the duration of the control gate voltage pulse is an increasing function of the time.

11. The method of claim 9, further comprising:
in response to the read command, determining a magnitude of the control gate voltage pulse based on whether the time is greater than the demarcation time, the control gate voltage pulse applied to the drain-end select gate transistor in the unselected NAND string has the determined magnitude.

12. The method of claim 11, wherein:
the magnitude of the control gate voltage pulse is an increasing function of the time.

13. The method of claim 9, wherein:
the selected NAND string is connected to a bit line; and
before increasing a voltage of the bit line from an initial level to a higher level, the method further comprises determining a delay in the increase of the voltage of the bit line relative to the increase of the control gate voltages of the unselected memory cells, the delay is an increasing function of the time since the last sensing operation in the block.

14. The method of claim 9, further comprising:
determining a temperature, wherein the duration of the control gate voltage pulse is determined as a decreasing function of the temperature.

15. The method of claim 14, wherein:
the duration of the control gate voltage pulse is lower when the temperature is below −15 degrees C. than when the temperature is above 15 degrees C.

16. The method of claim 9, wherein the selected NAND string is connected to a bit line, the method further comprising:
determining whether to delay an increase of a voltage of the bit line from an initial level to a higher level relative to the increasing of the control gate voltages of the unselected memory cells to the read pass level based on whether the time is greater than the demarcation time.

17. An apparatus, comprising:
a plurality of NAND strings in a block, each NAND string comprising a source-end select gate transistor, a drain-end select gate transistor, and memory cells between the source-end select gate transistor and the drain-end select gate transistor, wherein the plurality of NAND strings comprise a selected NAND string and an unselected NAND string;
a selected word line connected to a selected memory cell in the selected NAND string and to an unselected memory cell in the unselected NAND string;
unselected word lines connected to unselected memory cells in the selected NAND string and in the unselected NAND string;
a tracking circuit configured to track an indicator of a floating voltage of the unselected word lines; and
a control circuit, the control circuit configured to, in a read operation for the selected memory cell:
increase a voltage of the unselected word lines from an initial level to a read pass level;
during the increase, and in response to the indicator, provide a control gate voltage pulse for the drain-end select gate transistor in the unselected NAND string; and
after the control gate voltage pulse, provide a voltage of the selected word line at a control gate read level while sensing the selected memory cell, wherein:
the selected NAND string is connected to a bit line;
the indicator comprises a time since a last sensing operation in the block; and
the control circuit is configured to delay an increase of a voltage of the bit line from an initial level to a higher level relative to the increase of the voltage of the unselected word lines when the time since the last sensing operation in the block is greater than a demarcation time, and to not delay the increase of the voltage of the bit line from the initial level to the higher level relative to the increase of the voltage of the unselected word lines when the time since the last sensing operation in the block is not greater than the demarcation time.

18. The apparatus of claim 17, wherein:
a duration of the control gate voltage pulse is an increasing function of the time.

19. The apparatus of claim 17, wherein:
a magnitude of the control gate voltage pulse is an increasing function of the time.

* * * * *